US012540400B2

(12) United States Patent

Zhu et al.

(10) Patent No.: US 12,540,400 B2

(45) Date of Patent: Feb. 3, 2026

(54) MULTI-FLOW GAS CIRCUITS, PROCESSING CHAMBERS, AND RELATED APPARATUS AND METHODS FOR SEMICONDUCTOR MANUFACTURING

(71) Applicant: Applied Materials, Inc., Santa Clara, CA (US)

(72) Inventors: Zuoming Zhu, Sunnyvale, CA (US); Shu-Kwan Lau, Sunnyvale, CA (US); Errol Antonio C. Sanchez, Tracy, CA (US); Abhishek Dube, Fremont, CA (US); Ala Moradian, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 110 days.

(21) Appl. No.: 18/500,690

(22) Filed: Nov. 2, 2023

(65) Prior Publication Data

US 2025/0146134 A1 May 8, 2025

(51) Int. Cl.

| | |
|---|---|
| ***C23C 16/52*** | (2006.01) |
| ***C23C 16/455*** | (2006.01) |
| ***H01L 21/67*** | (2006.01) |

(52) U.S. Cl.

CPC ........ *C23C 16/52* (2013.01); *C23C 16/45508* (2013.01); *C23C 16/45589* (2013.01); *H01L 21/67028* (2013.01); *H01L 21/67069* (2013.01)

(58) Field of Classification Search

CPC .............. C23C 16/52; C23C 16/45508; C23C 16/45589; H01L 21/67028; H01L 21/67069

See application file for complete search history.

(56) References Cited

U.S. PATENT DOCUMENTS 5,488,967 A 2/1996 Minami et al.
6,858,062 B2 * 2/2005 Choi ...................... C23C 16/42 96/417

(Continued)

FOREIGN PATENT DOCUMENTS

CN 111725114 A 9/2020
CN 113990780 A 1/2022

(Continued)

OTHER PUBLICATIONS

International Search Report and Written Opinion dated Mar. 28, 2025 for Application No. PCT/US2024/053338.

*Primary Examiner* — Angelisa L. Hicks

(74) *Attorney, Agent, or Firm* — Patterson + Sheridan, LLP

(57) ABSTRACT

Embodiments of the present disclosure relate to multi-flow gas circuits, processing chambers, and related apparatus and methods applicable for semiconductor manufacturing. In one or more embodiments, a processing chamber includes a chamber body, one or more heat sources, and a gas circuit in fluid communication with the chamber body. The gas circuit includes a first flow controller and a first set of valves in fluid communication with the first flow controller. The first set of valves are in fluid communication with a first set of inject passages. The gas circuit includes a second flow controller and a second set of valves in fluid communication with the second flow controller. The second set of valves is in fluid communication with a second set of inject passages. The second set of inject passages and the first set of inject passages alternate with respect to each other along the plurality of flow levels.

20 Claims, 30 Drawing Sheets

(56) References Cited

U.S. PATENT DOCUMENTS

| | | | | |
|---|---|---|---|---|
| 7,300,885 | B2 * | 11/2007 | Hasebe | C23C 16/45523 427/255.393 |
| 8,673,081 | B2 | 3/2014 | Sivaramakrishnan et al. | |
| 8,834,955 | B2 | 9/2014 | Bauer et al. | |
| 9,570,330 | B2 | 2/2017 | Hofmeister et al. | |
| 9,620,395 | B2 | 4/2017 | Yang et al. | |
| 9,640,416 | B2 | 5/2017 | Arai | |
| 9,725,804 | B2 * | 8/2017 | Hirose | C23C 16/45527 |
| 9,871,350 | B2 | 1/2018 | McLaurin et al. | |
| 9,875,895 | B2 | 1/2018 | Yang et al. | |
| 10,161,036 | B2 | 12/2018 | Hyon et al. | |
| 10,229,844 | B2 * | 3/2019 | Sawachi | H01L 21/67253 |
| 10,392,702 | B2 | 8/2019 | Jung et al. | |
| 10,453,721 | B2 | 10/2019 | Brashear et al. | |
| 10,460,960 | B2 * | 10/2019 | Kumar | H01L 21/67017 |
| 10,741,396 | B2 | 8/2020 | Jung et al. | |
| 10,755,955 | B2 | 8/2020 | Ishii et al. | |
| 10,903,625 | B2 | 1/2021 | McLaurin et al. | |
| 11,111,580 | B2 | 9/2021 | Kang et al. | |
| 2001/0007244 | A1 | 7/2001 | Matsuse | |
| 2007/0140814 | A1 | 6/2007 | Kurita et al. | |
| 2014/0137961 | A1 * | 5/2014 | Kao | H01L 21/67017 137/561 R |
| 2016/0208382 | A1 * | 7/2016 | Takahashi | C23C 16/45544 |
| 2016/0362813 | A1 | 12/2016 | Bao et al. | |
| 2018/0315626 | A1 | 11/2018 | Franklin | |
| 2021/0010130 | A1 * | 1/2021 | Narushima | C23C 16/4481 |
| 2021/0028075 | A1 | 1/2021 | Zhu et al. | |
| 2021/0324514 | A1 | 10/2021 | Ye et al. | |
| 2022/0121196 | A1 | 4/2022 | Omori | |
| 2022/0162751 | A1 | 5/2022 | Haanstra et al. | |
| 2022/0170156 | A1 | 6/2022 | Jdira et al. | |
| 2022/0181193 | A1 | 6/2022 | Gao et al. | |
| 2022/0189804 | A1 | 6/2022 | Luan et al. | |
| 2022/0199444 | A1 | 6/2022 | Oosterlaken et al. | |
| 2022/0254668 | A1 | 8/2022 | Oosterlaken et al. | |
| 2022/0268520 | A1 | 8/2022 | Oosterlaken et al. | |
| 2022/0298643 | A1 | 9/2022 | Kajbafvala et al. | |
| 2022/0298672 | A1 | 9/2022 | M'Saad et al. | |
| 2022/0301829 | A1 | 9/2022 | Yoshikawa | |
| 2022/0301905 | A1 | 9/2022 | Ye et al. | |
| 2022/0301906 | A1 | 9/2022 | Naik et al. | |
| 2022/0352006 | A1 | 11/2022 | Huang et al. | |
| 2022/0359246 | A1 | 11/2022 | Umeoka | |
| 2025/0068191 | A1 * | 2/2025 | Choo | C23C 16/45561 |

FOREIGN PATENT DOCUMENTS

| | | | |
|---|---|---|---|
| CN | 111893567 | B | 2/2022 |
| CN | 114000192 | A | 2/2022 |
| CN | 111254487 | B | 3/2022 |
| CN | 114138030 | A | 3/2022 |
| CN | 114150381 | A | 3/2022 |
| CN | 114158145 | A | 3/2022 |
| CN | 114351249 | A | 4/2022 |
| CN | 216357351 | U | 4/2022 |
| CN | 110854044 | B | 5/2022 |
| CN | 111235551 | B | 5/2022 |
| CN | 114481311 | A | 5/2022 |
| CN | 114540947 | A | 5/2022 |
| CN | 114540948 | A | 5/2022 |
| CN | 114551331 | A | 5/2022 |
| CN | 114613703 | A | 6/2022 |
| CN | 114743924 | A | 7/2022 |
| CN | 114823428 | A | 7/2022 |
| CN | 114855272 | A | 8/2022 |
| CN | 114883221 | A | 8/2022 |
| CN | 114914181 | A | 8/2022 |
| CN | 114927450 | A | 8/2022 |
| CN | 115020281 | A | 9/2022 |
| CN | 115101432 | A | 9/2022 |
| CN | 115101443 | A | 9/2022 |
| CN | 115101470 | A | 9/2022 |
| CN | 115233303 | A | 10/2022 |
| CN | 115235257 | A | 10/2022 |
| CN | 115274510 | A | 11/2022 |
| CN | 115312432 | A | 11/2022 |
| CN | 115404543 | A | 11/2022 |
| EP | 2845921 | B1 | 6/2016 |
| JP | 2016009724 | A | 1/2016 |
| WO | 2013016532 | A1 | 1/2013 |
| WO | 2019195292 | A1 | 10/2019 |

* cited by examiner

MULTI-FLOW GAS CIRCUITS, PROCESSING CHAMBERS, AND RELATED APPARATUS AND METHODS FOR SEMICONDUCTOR MANUFACTURING

BACKGROUND

Field

Embodiments of the present disclosure relate to multi-flow gas circuits, processing chambers, and related apparatus and methods applicable for semiconductor manufacturing.

Description of the Related Art

Semiconductor substrates are processed for a wide variety of applications, including the fabrication of integrated devices and micro-devices. One method of processing substrates includes depositing a material, such as a dielectric material or a semiconductor material, on an upper surface of the substrate. The material may be deposited in a lateral flow chamber by flowing a process gas parallel to the surface of a substrate positioned on a support, and thermally decomposing the process gas to deposit a material from the gas onto the substrate surface.

However, operations (such as epitaxial deposition operations) can be long, expensive, and inefficient, and can have limited capacity and throughput. Moreover, hardware and operations can be limited with respect to the structures that can be formed on substrates. Additionally, processing can involve non-uniformities, which can involve hindered device performance and/or reduced throughput. Such issues can be exacerbated in batch processing operations.

Therefore, a need exists for improved apparatuses and methods in semiconductor processing.

SUMMARY

Embodiments of the present disclosure relate to multi-flow gas circuits, processing chambers, and related apparatus and methods applicable for semiconductor manufacturing.

In one or more embodiments, a processing chamber applicable for semiconductor manufacturing includes a chamber body. The chamber body includes a processing volume, a plurality of inject passages formed in the chamber body and arranged in a plurality of flow levels, and one or more exhaust passages formed in the chamber body. The processing chamber includes one or more heat sources configured to heat the processing volume, and a gas circuit in fluid communication with the chamber body. The gas circuit includes a first flow controller and a first set of valves in fluid communication with the first flow controller. The first set of valves are in fluid communication with a first set of inject passages. The gas circuit includes a second flow controller and a second set of valves in fluid communication with the second flow controller. The second set of valves is in fluid communication with a second set of inject passages. The second set of inject passages and the first set of inject passages alternate with respect to each other along the plurality of flow levels.

In one or more embodiments, a gas circuit applicable for semiconductor manufacturing includes a first flow controller, a first set of valves in fluid communication with the first flow controller, and a first supply valve and a first supply line in fluid communication with the first flow controller. The gas circuit includes a second flow controller and a second set of valves in fluid communication with the second flow controller. The second set of valves and the first set of valves alternate with respect to each other. The gas circuit includes a second supply valve and a second supply line in fluid communication with the second flow controller.

In one or more embodiments, a processing chamber applicable for semiconductor manufacturing includes a chamber body, and the chamber body includes a plurality of inject passages arranged in a plurality of flow levels. The processing chamber includes a gas circuit in fluid communication with the chamber body. The gas circuit includes a first flow controller and a first set of valves in fluid communication with the first flow controller. The first set of valves is in fluid communication with a first set of inject passages. The gas circuit includes a second flow controller and a second set of valves in fluid communication with the second flow controller. The second set of valves is in fluid communication with a second set of inject passages. The second set of inject passages and the first set of inject passages alternate with respect to each other along a first zone of the plurality of flow levels. The gas circuit includes a third flow controller and a third set of valves in fluid communication with the third flow controller. The third set of valves is in fluid communication with a third set of inject passages. The gas circuit includes a fourth flow controller and a fourth set of valves in fluid communication with the fourth flow controller. The fourth set of valves is in fluid communication with a fourth set of inject passages. The fourth set of inject passages and the third set of inject passages alternate with respect to each other along a second zone of the plurality of flow levels.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
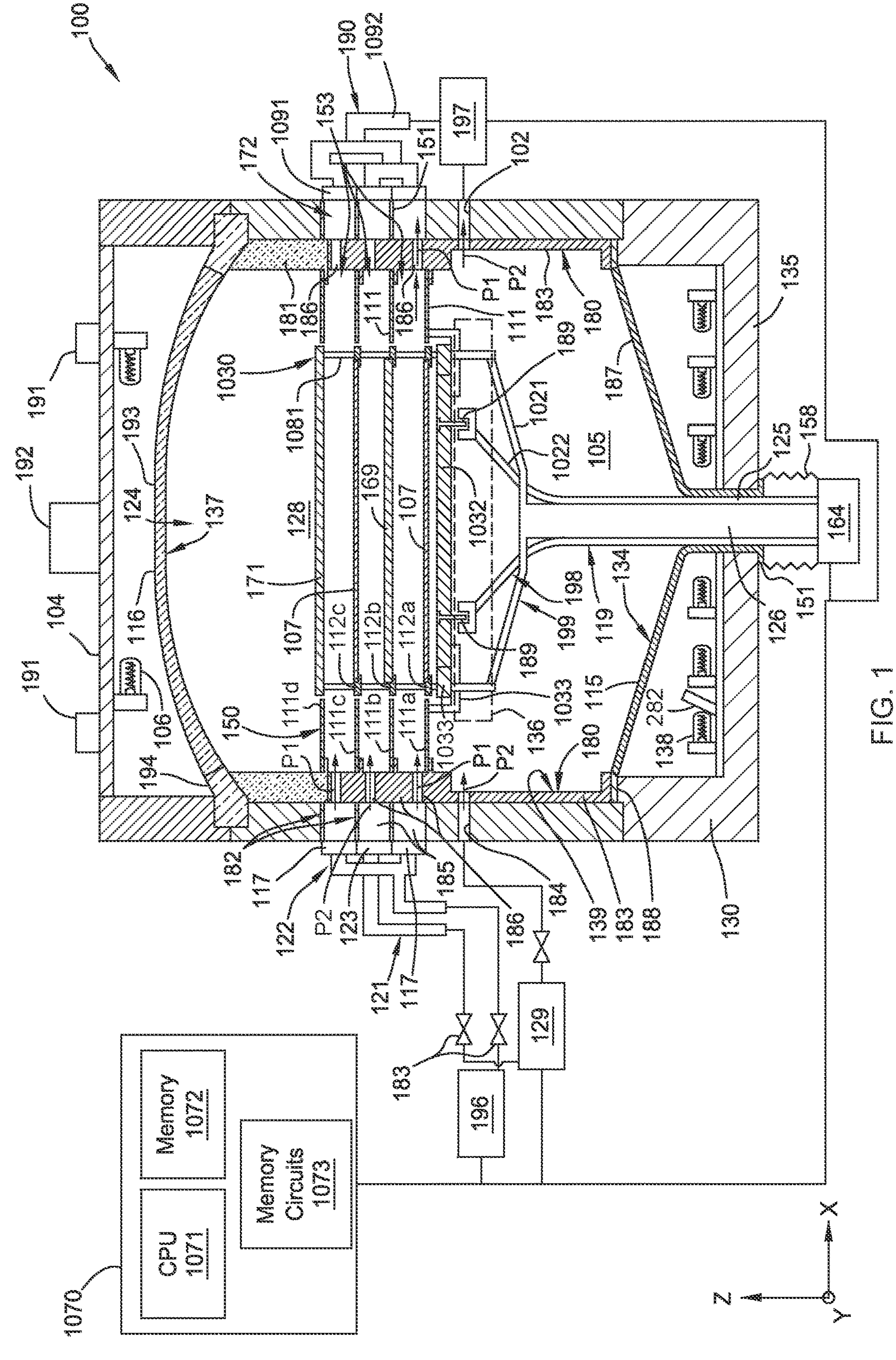
FIG. 1 is a schematic cross-sectional side view of a processing chamber, according to one or more embodiments.

For visual clarity purposes, hatching is omitted from FIGS. 3A-3D, 6, 7A-7B, 9, 12, 15A-15F 17A-17F, 21A-21B, 22A-22B, 23A-23B, and 24A-24B. For visual clarity purposes, certain hatching is omitted from FIGS. 1 and 2.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to multi-flow gas circuits, chamber kits, processing chambers, and related apparatus and methods applicable for semiconductor manufacturing. Embodiments of the present disclosure relate to multi-flow methods and related apparatus applicable for semiconductor manufacturing. The subject matter described herein can be used to process a single substrate at a time or two or more substrates simultaneously.

The disclosure contemplates that terms such as "couples," "coupling," "couple," and "coupled" may include but are not limited to embedding, bonding, welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Figure 2:
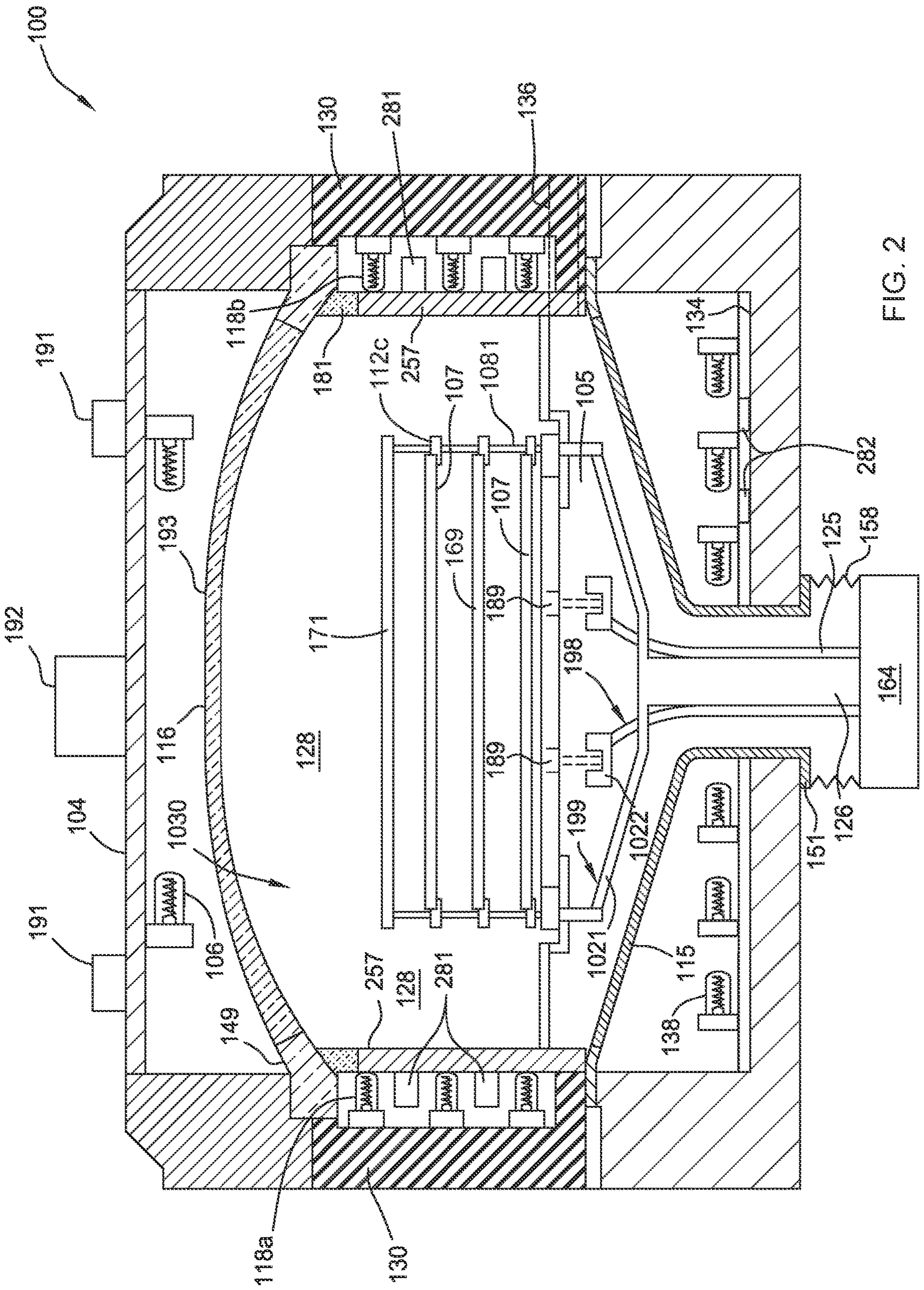
FIG. 2 is a schematic cross-sectional side view of the processing chamber shown in FIG. 1, according to one or more embodiments.

FIG. 1 is a schematic cross-sectional side view of a processing chamber 100, according to one or more embodiments. The side heat sources 118*a*, 118*b* shown in FIG. 2 are not shown in FIG. 1 for visual clarity purposes. The processing chamber 100 includes a chamber body 130 that defines an internal volume 124. The internal volume 124 includes a processing volume 128.

A chamber kit 150 is positioned in the processing volume 128 and at least partially supported by a substrate support assembly 119 (such as a pedestal assembly and/or a ring assembly). The chamber kit 150 includes a first plate 1032, a second plate 171, and a plurality of levels that support a plurality of substrates 107 (two are shown) for simultaneous processing (e.g., epitaxial deposition). The present disclosure contemplates that the first plate 1032 can be omitted. In the implementation shown in FIG. 1, the chamber kit 150 supports two substrates. The chamber kit 150 can support other numbers of substrates, including but not limited to three substrates 107, four substrates 107, six substrates 107, or eight substrates 107. The processing chamber 100 includes an upper window 116, such as a dome, disposed between a lid 104 and the processing volume 128.

The processing chamber 100 includes a lower window 115 disposed below the processing volume 128. One or more upper heat sources 106 are positioned above the processing volume 128 and the upper window 116. The one or more upper heat sources 106 can be radiant heat sources such as lamps, for example halogen lamps. The one or more upper heat sources 106 are disposed between the upper window 116 and the lid 104. The upper heat sources 106 can be positioned to facilitate uniform heating of the substrates 107. One or more lower heat sources 138 are positioned below the processing volume 128 and the lower window 115. The one or more lower heat sources 138 can be radiant heat sources such as lamps, for example halogen lamps. The lower heat sources 138 are disposed between the lower window 115 and a floor 134 of the internal volume 124. The lower heat sources 138 can be positioned to facilitate uniform heating of the substrates 107.

The present disclosure contemplates that other heat sources may be used (in addition to or in place of the lamps) for the various heat sources described herein. For example, resistive heaters, light emitting diodes (LEDs), and/or lasers may be used for the various heat sources described herein.

The upper and lower windows 116, 115 may be transparent to the infrared radiation, such as by transmitting at least 80% (such as at least 95%) of infrared radiation. The upper and lower windows 116, 115 may be a quartz material (such as a transparent quartz). In one or more embodiments, the upper window 116 includes an inner window 193 and outer window supports 194. The inner window 193 may be a thin quartz window. The outer window supports 194 support the inner window 193 and are at least partially disposed within a support groove. In one or more embodiments, the lower window 115 includes an inner window 187 and outer window supports 188. The inner window 187 may be a thin quartz window. The outer window supports 188 support the inner window 187.

The substrate support assembly 119 is disposed in the processing volume 128. One or more liners 180 are disposed in the processing volume 128 and surround the substrate support assembly 119. The one or more liners 180 facilitate shielding the chamber body 130 from processing chemistry in the processing volume 128. The chamber body 130 is disposed at least partially between the upper window 116 and the lower window 115. The one or more liners 180 are disposed between the processing volume 128 and the chamber body 130. The one or more liners 180 include an upper liner 181 and one or more lower liners 183.

The processing chamber 100 includes one or more gas inject passages 182 (a plurality is shown in FIG. 1) formed in the chamber body 130 and in fluid communication with the processing volume 128, and one or more gas exhaust passages 172 (a plurality is shown in FIG. 1) formed in the chamber body 130 opposite the one or more gas inject passages 182. The one or more gas exhaust passages 172 are in fluid communication with the processing volume 128. Each of the one or more gas inject passages 182 and one or more gas exhaust passages 172 are formed through one or more sidewalls of the chamber body 130 and through the one or more liners 180 that line the one or more sidewalls of the chamber body 130.

Each gas inject passage 182 includes a gas channel 185 formed in the chamber body 130 and one or more gas openings 186 (a plurality is shown in FIG. 1) formed in the one or more liners 180. One or more supply conduit systems are in fluid communication with the one or more gas inject passages 182. In FIG. 1, an inner supply conduit system 121 and an outer supply conduit system 122 are in fluid communication with a plurality of gas inject passages 182. The inner supply conduit system 121 includes an inner gas box 123 mounted to the chamber body 130 and in fluid communication with an inner set of the gas inject passages 182. The outer supply conduit system 122 includes a plurality of outer gas boxes 117 mounted to the chamber body 130 and in fluid communication with an outer set of the gas inject passages 182. The present disclosure contemplates that a variety of gas supply systems (e.g., supply conduit system(s), gas inject passages, and/or gas boxes different than what is shown in FIG. 1) may be used.

The processing chamber 100 includes a chamber kit 150. The chamber kit 150 includes a plurality of pre-heat rings 111*a*-111*d* positioned outwardly of the substrates 107 and the first and second plates 1032, 171. Four pre-heat rings 111*a*-111*d* are shown in FIG. 1. Other numbers (such as two or three) of the pre-heat rings 111 may be used. The chamber kit 150 divides the processing volume into a plurality of flow levels 153 (three flow levels are shown in FIG. 1). In one or more embodiments, the chamber kit 150 includes at least two (such as at least three) flow levels 153. The one or more gas inject passages 182 are positioned as a plurality of inject levels such that each gas inject passage 182 corresponds to one of the plurality of inject levels. Each inject level aligns with a respective flow level 153. The pre-heat rings 111*a*-111*d* are coupled to and/or at least partially supported by the one or more liners 180. In one or more embodiments, the pre-heat rings 111*a*-111*d* each include a complete ring or one or more ring segments, such as a C-ring segment and/or a plurality of ring segments.

The chamber kit 150 includes a plurality of arcuate supports 112*a*-112*c*. A first arcuate support 112*a* is configured to support one of the substrates 107, a second arcuate support 112*b* is configured to support the plate 169, and a third arcuate support 112*c* supports the other of the substrates 107. The chamber kit 150 also includes one or more support rod structures 1081 (a plurality is shown) that support the arcuate supports 112*a*-112*c*. The one or more support rod structures 1081 sized and shaped to extend through the arcuate supports 112*a*-112*c* and into the second plate 171. In one or more embodiments, the arcuate supports 112*a*-112*c* each include a complete ring or one or more ring segments, such as a C-ring segment and/or a plurality ring segments.

During operations (such as during an epitaxial deposition operation), one or more process gases P1 are supplied to the processing volume 128 through the outer supply conduit system 122, and through the one or more gas inject passages 182. The one or more process gases P1 are supplied from one or more gas sources 196 in fluid communication with the one or more gas inject passages 182. Each of the gas inject passages 182 is configured to direct the one or more processing gases P1 in a generally radially inward direction towards the chamber kit 150. As such, in one or more embodiments, the gas inject passages 182 may be part of a cross-flow gas injector. The flow(s) of the one or more process gases P1 can be divided into at least some (such as two or more) of the plurality of flow levels 153. For at least the uppermost flow level 153 (or a single flow level 153—if a single flow level 153 is used), the one or more process gases P1 can be guided (using the second plate 171) along a streamlined flow path such that diversive flow away from the uppermost substrate 107 (or a single substrate 107—if a single substrate 107 is used) is reduced or eliminated.

The processing chamber 100 includes an exhaust conduit system 190. The one or more process gases P1 can be exhausted through exhaust gas openings formed in the one or more liners 180, exhaust gas channels formed in the chamber body 130, and then through exhaust gas boxes 1091. The one or more process gases P1 can flow from exhaust gas boxes 1091 and to an optional common exhaust box 1092, and then out through a conduit using one or more pump devices 197 (such as one or more vacuum pumps).

The one or more processing gases P1 can include, for example, purge gases, cleaning gases, and/or deposition gases. The deposition gases can include, for example, one or more reactive gases carried in one or more carrier gases. The one or more reactive gases can include, for example, silicon and/or germanium containing gases (such as silane ($SiH_4$), disilane ($Si_2H_6$), dichlorosilane ($SiH_2Cl_2$), and/or germane ($GeH_4$)), chlorine containing etching gases (such as hydrogen chloride (HCl)), and/or dopant gases (such as phosphine ($PH_3$) and/or diborane ($B_2H_6$)). One or more inert gases (e.g., the purge gases and/or carrier gases) can include, for example, one or more of argon (Ar), helium (He), nitrogen ($N_2$), hydrogen chloride (HCl), and/or hydrogen ($H_2$).

Inert gas P2 (e.g., purge gas) supplied from an inert gas source 129 is introduced to a bottom region 105 of the internal volume 124 through one or more lower gas inlets 184 formed in the sidewall of the chamber body 130. The inert gas P2 can also be supplied through the inner supply conduit system 121 and over a plate 169 positioned between the two substrates 107.

The one or more lower gas inlets 184 are disposed at an elevation below the one or more gas inject passages 182. If the one or more liners 180 are used, a section of the one or more liners 180 may be disposed between the one or more gas inject passages 182 and the one or more lower gas inlets 184. The one or more lower gas inlets 184 are configured to direct the inert gas P2 in a generally radially inward direction. The one or more lower gas inlets 184 may be configured to direct the inert gas P2 in an upward direction. During a film formation process, the substrate support assembly 119 is located at a position that can facilitate the inert gas P2 to flow generally along a flow path across a back side of the first plate 1032. The inert gas P2 exits the bottom region 105 and is exhausted out of the processing chamber 100 through one or more lower gas exhaust passages 102 located on the opposite side of the processing volume 128 relative to the one or more lower gas inlets 184.

The substrate support assembly 119 includes a first lift frame 199 and a second lift frame 198 disposed at least partially about the first lift frame 199. The first lift frame 199 includes first arms 1021 coupled to an outer ring 1033 such that lifting and lowering the first lift frame 199 lifts and lowers the substrates 107, the first plate 1032, the second plate 171, and the plate 169. A plurality of lift pins 189 are suspended from the first plate 1032. Lowering of the first plate 1032 and/or lifting of the second lift frame 198 initiates contact of the lift pins 189 with arms 1022 of the second lift frame 198. Continued lowering of the first plate 1032 and/or lifting of the second lift frame 198 initiates contact of the lift pins 189 with a substrate 107 and/or the plate 169 such that the lift pins 189 raise the substrate 107 and/or the plate 169. A bottom region 105 of the processing chamber 100 is defined between the floor 134 and a cassette 1030. As shown in FIG. 1, the lift pins 189 can be configured to abut against—and be lifted from—the arms 1022.

A first shaft 126 of the first lift frame 199, a second shaft 125 of the second lift frame 198, and a section 151 of the lower window 115 extend through a port formed in a bottom 135 of the chamber body 130 and the floor 134. Each shaft 125, 126 is coupled to one or more respective motors 164, which are configured to independently raise, lower, and/or rotate the substrates 107 and the plate 169 using the first lift frame 199, and to independently raise and lower the lift pins 189 using the second lift frame 198. The first lift frame 199 includes the first shaft 126 and a plurality of first arms 1021 configured to support the first plate 1032, the substrate supports 112, and the second plate 171.

The arcuate supports 112*a*-112*c* are part of the cassette 1030 supported by the first lift frame 199 and disposed in the processing volume 128. The plurality of inject passages 182 are in fluid communication with respective flow paths above the plurality of arcuate supports 112*a*-112*c*.

The second lift frame 198 includes the second shaft 125 and the plurality of second arms 1022 configured to interface with and support the lift pins 189. A bellows assembly 158 circumscribes and encloses a portion of the shafts 125, 126 disposed outside the chamber body 130 to facilitate reduced or eliminated vacuum leakage outside the chamber body 130.

An opening 136 (a substrate transfer opening) is formed through the one or more sidewalls of the chamber body 130. The opening 136 may be used to transfer the plate 169 and/or the substrates 107 to or from the arcuate supports 112*a*-112*c*, e.g., in and out of the internal volume 124. In one or more embodiments, the opening 136 includes a slit valve. In one or more embodiments, the opening 136 may be connected to any suitable valve that enables the passage of substrates therethrough. The opening 136 is shown in ghost in FIGS. 1 and 2 for visual clarity purposes.

The processing chamber 100 may include one or more sensors 191, 192, 282, such as temperature sensors (e.g., optical pyrometers) or other metrology sensors, which measure temperatures (or other parameters) within the processing chamber 100 (such as on the surfaces of the upper window 116, the first plate 1032, the second plate 171, the plate 169, the arcuate supports 112*a*-112*c*, the pre-heat rings 111*a*-111*d*, and/or the substrates 107). The one or more sensors 191, 192, 282 are disposed on the lid 104. The one or more sensors 282 (e.g., lower pyrometers)—which are shown in FIG. 2—are disposed on a lower side of the lower window 115. The one or more sensors 282 can be disposed adjacent to and/or on the bottom 135 of the chamber body 130.

In one or more embodiments, upper sensors 191, 192 are oriented toward a top of the second plate 171 and/or a top of a fourth pre-heat ring 111*d*. In one or more embodiments, side sensors 281 (e.g., side temperature sensors) are oriented toward one or more of the arcuate supports 112*a*-112*c* and/or the pre-heat rings 111*a*-111*d*. In one or more embodiments, one or more lower sensors 282 are oriented toward a bottom of the chamber kit 150 (such as a lower surface of the first plate 1032, a bottom of the second plate 171, and/or a bottom of the first pre-heat ring 111*a*.

The processing chamber 100 includes a controller 1070 configured to control the processing chamber 100 or components thereof. For example, the controller 1070 may control the operation of components of the processing chamber 100 using a direct control of the components or by controlling controllers associated with the components. In operation, the controller 1070 enables data collection and feedback from the respective chambers to coordinate and control performance of the processing chamber 100.

The controller 1070 generally includes a central processing unit (CPU) 1071, a memory 1072, and support circuits 1073. The CPU 1071 may be one of any form of a general purpose processor that can be used in an industrial setting. The memory 1072, or non-transitory computer readable medium, is accessible by the CPU 1071 and may be one or more of memory such as random access memory (RAM), read only memory (ROM), floppy disk, hard disk, or any other form of digital storage, local or remote. The support circuits 1073 are coupled to the CPU 1071 and may include cache, clock circuits, input/output subsystems, power supplies, and the like.

The various methods and operations disclosed herein may generally be implemented under the control of the CPU 1071 by the CPU 1071 executing computer instruction code stored in the memory 1072 (or in memory of a particular processing chamber) as, e.g., a software routine. When the computer instruction code is executed by the CPU 1071, the CPU 1071 controls the components of the processing chamber 100 to conduct operations in accordance with the various methods and operations described herein. In one or more embodiments, the memory 1072 (a non-transitory computer readable medium) includes instructions stored therein that, when executed, cause the methods and operations described herein to be conducted. The controller 1070 can be in communication with the heat sources, the gas sources, and/or the vacuum pump(s) of the processing chamber 100, for example, to cause a plurality of operations to be conducted.

The first plate 1032 and/or the one or more liners 180 (such as the upper liner 181 and/or the one or more lower liners 183), are formed of one or more of quartz (such as transparent quartz, e.g. clear quartz; opaque quartz, e.g. white quartz, grey quartz, and/or black quartz), silicon carbide (SiC), graphite coated with SiC and/or opaque quartz, and/or one or more ceramics (such as alumina (aluminum oxide ($Al_2O_3$)), Aluminum nitride (AlN), Silicon Nitride ($Si_3N_4$), Boron Nitride (BN), and/or Boron Carbide ($B_4C$))).

FIG. 2 is a schematic cross-sectional side view of the processing chamber 100 shown in FIG. 1, according to one or more embodiments. The cross-sectional view shown in FIG. 2 is rotated by 55 degrees relative to the cross-sectional view shown in FIG. 1.

The processing chamber 100 includes one or more side heat sources 118*a*, 118*b* (e.g., side lamps, side resistive heaters, side LEDs, and/or side lasers, for example) positioned outwardly of the processing volume 128. One or more second side heat sources 118*b* are opposite one or more first side heat sources 118*a* across the processing volume 128.

In FIG. 2, the pre-heat rings 111*a*-111*d* are not shown for visual clarity purposes. In addition to the one or more sensors 191, 192 positioned above the processing volume 128 and above the second plate 171, the processing chamber 100 may include one or more sensors 281, such as temperature sensors (e.g., optical pyrometers) or other metrology sensors, which measure temperatures (or other parameters) within the processing chamber 100. A plurality of windows 257—if used—can be disposed in gaps between or formed in the one or more liners 180 (such as the upper liner 181 and/or the one or more lower liners 183). The one or more sensors 281 are side sensors (e.g., side pyrometers) that are positioned outwardly of the processing volume 128, outwardly of the pre-heat rings 111*a*-111*d* (shown in FIG. 1), and outwardly of the plurality of windows 257. The one or more sensors 281 can be radially aligned, for example, with the plurality of windows 257 (as shown in FIG. 2).

The one or more side sensors 281 (such as one or more pyrometers) can be used to measure temperatures (or other parameters) within the processing volume 128 from respective sides of the processing volume 128. The side sensors 281 are arranged in a plurality of sensor levels (two sensor levels are shown in FIG. 2). In one or more embodiments, the number of sensor levels is equal to the number of heat source levels. Each side sensor 281 can be oriented horizontally or can be directed (e.g., oriented downwardly at an angle) toward the substrate 107 and/or the substrate support 112 of a respective level of the cassette 1030.

The present disclosure contemplates that the side heat sources 118*a*, 118*b*, the windows 257, and/or the side sensors 281 can be omitted.

FIGS. 3A-3D are schematic partial side cross-sectional views of the processing chamber 100 and a gas circuit 300 during a method of substrate processing.

The gas circuit 300 includes a first flow controller 310, a first set of valves 311, 312 in fluid communication with the first flow controller 310, and a first supply valve 313 and a first supply line 314 in fluid communication with the first flow controller 310. The first set of valves 311, 312 are in fluid communication with a first set of inject passages 182*a*. The gas circuit 300 includes a second flow controller 320, a second set of valves 321, 322 in fluid communication with the second flow controller 320, and a second supply valve 323 and a second supply line 324 in fluid communication with the second flow controller 320. The second set of valves 321, 322 and the first set of valves 311, 312 alternate with respect to each other. The second set of valves 321, 322 are in fluid communication with a second set of inject passages 182*b*. The second set of inject passages 182*b* and the first set of inject passages 182*a* alternate with respect to each other along the plurality of flow levels. The gas circuit 300 includes a third flow controller 330, a valve 331 in fluid communication with the third flow controller 330, and a third supply valve 332 and a third supply line 333 in fluid communication with the third flow controller 330. In one or more embodiments, the flow controllers 310, 320, 330 respectively include one or more mass flow controllers. In one or more embodiments the flow controllers 310, 320, 330 respectively are flow ratio controllers (FRCs). The valve 331 is in fluid communication with a lower inject passage 182*c* below the first set of inject passages 182*a* and the second set of inject passages 182*b*.

The gas circuit 300 includes a connection valve 315 in fluid communication between the first supply line 314 and the second supply line 324 at locations downstream of the first supply valve 313 and the second supply valve 323. A second connection valve is 325 is in fluid communication between the third supply line 333 and the first supply line 314 at a location downstream of the first supply valve 313. A third connection valve 335 is in fluid communication between the third supply line 333 and the second supply line at a location downstream of the second supply valve 323.

Figure 3A:
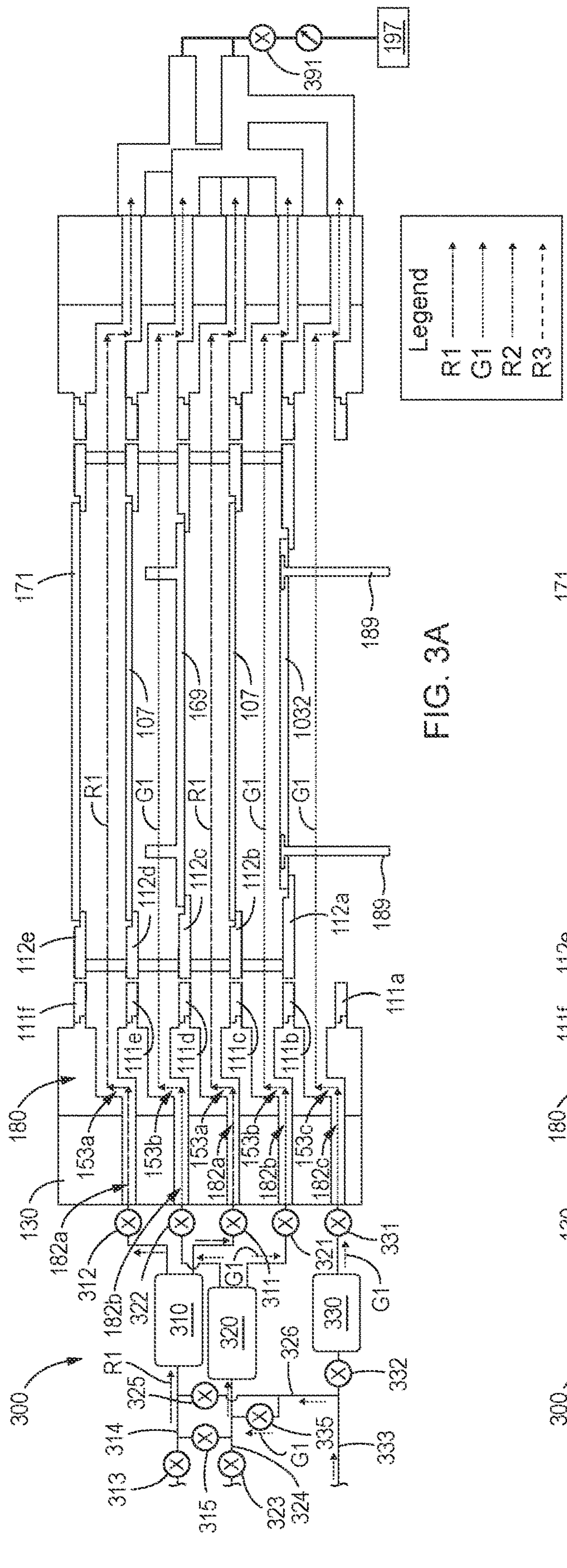
FIGS. 3A-3D are schematic partial side cross-sectional views of the processing chamber and a gas circuit during a method of substrate processing.

As shown in FIG. 3A the method includes flowing a first gas flow into a first set of flow levels 153A of the processing chamber 100, and flowing a second gas flow into a second set of flow levels 153B of the processing chamber 100 simultaneously with the flowing of the first gas flow. The first set of flow levels 153A and the second set of flow levels 153B alternate with respect to each other. The method also includes heating one or more substrates 107 positioned in the processing chamber 100. FIG. 3A shows the substrates 107 in a first position (e.g., an upper position). In one or more embodiments, the one or more substrates 107 include a plurality of substrates 107 (two are shown in FIG. 3A). In one or more embodiments, the first gas flow includes a first reactive gas R1 and the second gas flow includes an inert gas G1. In FIG. 3A, the first supply valve 313 and the first set of valves 311, 312 are open to supply the first reactive gas R1 through the first supply line 314 and the first flow controller 310. The second supply valve 323 and the second connection valve 325 are closed, and the third supply valve 332, the valve 331, and the second set of valves 321, 322 are open to supply the inert gas G1 through the third supply line 333 and a connection line 326. The connection valve 315 is closed in FIG. 3A. In the implementation shown in FIG. 3A, the processing chamber 100 includes five arcuate supports 112*a*-112*e* and six pre-heat rings 111*a*-111*f*. Other numbers are contemplated. An exhaust valve 391 is in fluid communication with the one or more pump devices 197.

The first set of flow levels 153*a* correspond respectively to first sides of the plurality of substrates 107 when in the first position such that, in one or more embodiments, the first reactive gas R1 respectively processes the first sides of the plurality of substrates 107. For example, the first reactive gas R1 can respectively form a layer, clean (such as pre-clean), or etch—respectively—the first sides of the plurality of substrates 107. As an example, the first reactive gas R1 can form a first layer 401 (shown in FIG. 4) respectively on the first sides of the plurality of substrates 107.

Figure 3B:
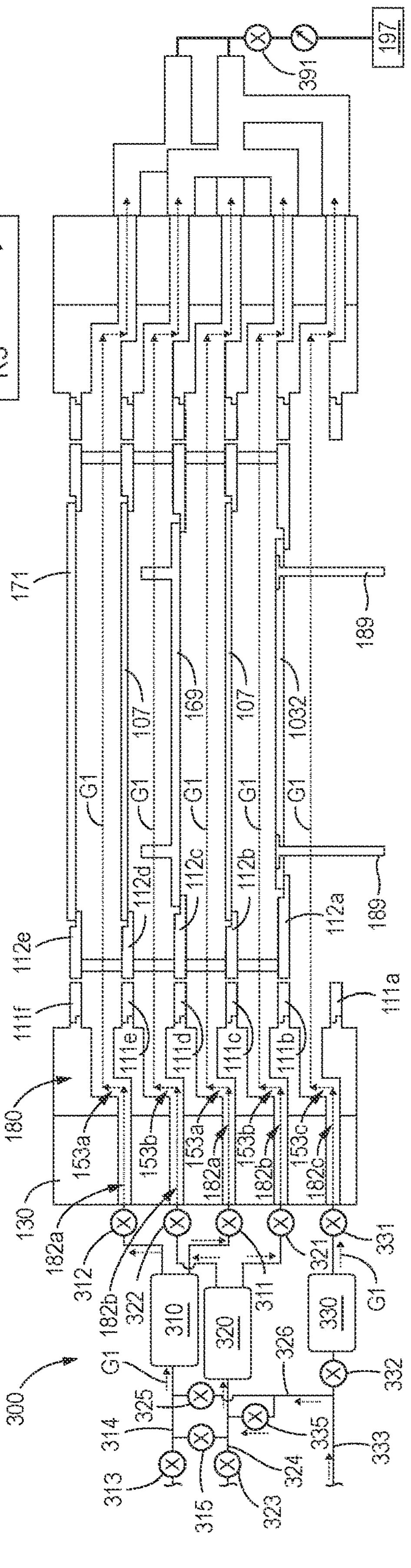

As shown in FIG. 3B, the method includes flowing the second gas flow (including the inert gas G1) into the first set of flow levels 153A simultaneously with the second set of flow levels 153B. In FIG. 3B, the first supply valve 313 is closed to halt the first reactive gas R1, and the second connection valve 325 is opened to supply the inert gas G1 to the first set of flow levels 153*a* through the connection line 326.

Figure 3C:
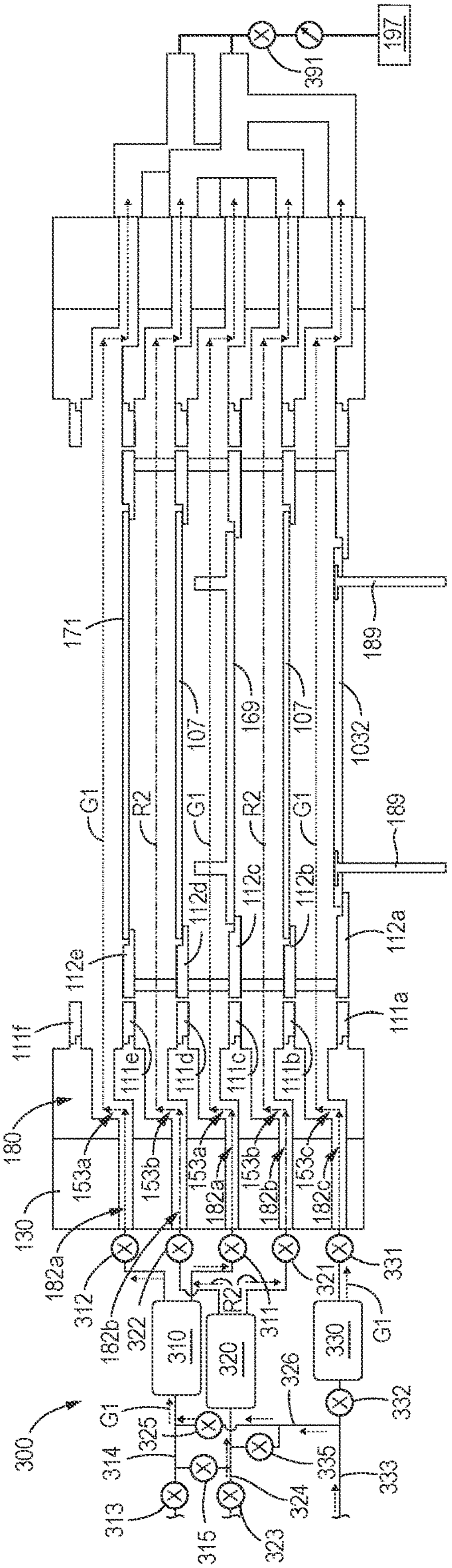

As shown in FIG. 3C, the method includes moving the one or more substrates 107 from the first position to a second position (e.g., a lower position), and flowing a second reactive gas R2 into the second set of flow levels 153*b*. The second set of flow levels 153*b* correspond respectively to the first sides of the plurality of substrates 107 when in the second position such that the second reactive gas R2 respectively processes the first layers 401. For example, the second reactive gas R2 can respectively form a layer, clean (such as pre-clean), or etch-respectively—the first layers 401. As an example, the second reactive gas R2 can form a second layer 402 (shown in FIG. 4) respectively on the first layers 401 of the plurality of substrates 107. The second reactive gas R2 has a different composition than the first reactive gas R1. In one or more embodiments, the first layers 401 have a first composition and the second layers 402 have a second composition different than the first composition. In FIG. 3C, the third connection valve 335 is closed, and the second supply valve 323 is opened to supply the second reactive gas R2 through the second supply line 324 and the second set of valves 321, 322.

Figure 3D:
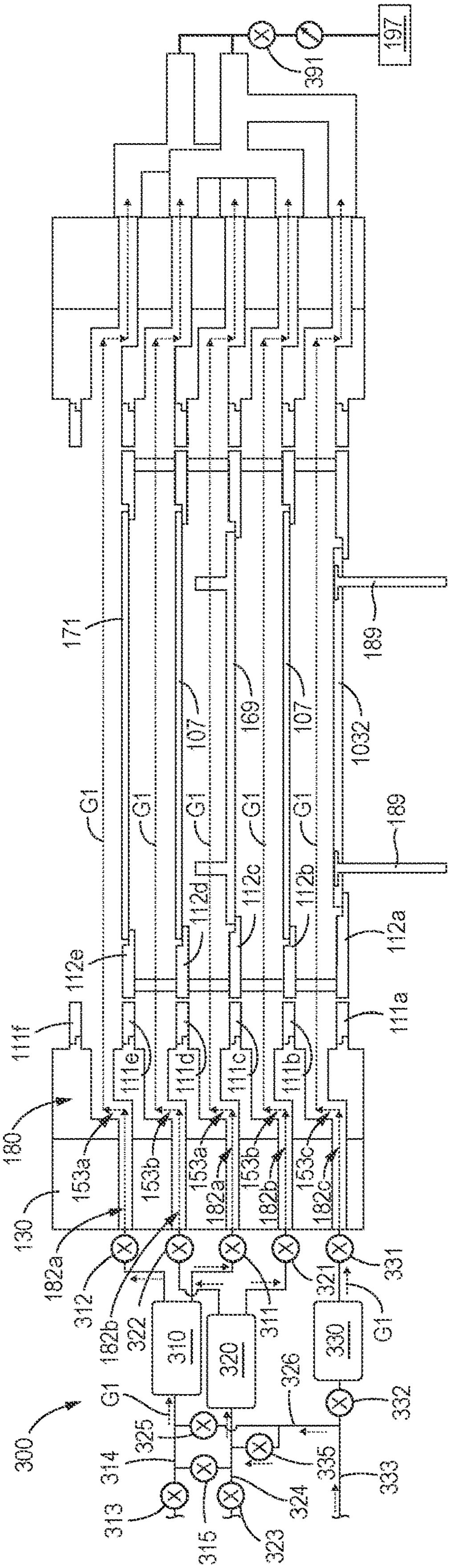

As shown in FIG. 3D, the method includes flowing the second gas flow (including the inert gas G1) into the second set of flow levels 153B simultaneously with the first set of flow levels 153A. In FIG. 3D, the second supply valve 323 is closed to halt the second reactive gas R2, and the second connection valve 325 is opened to supply the inert gas G1 to the first set of flow levels 153*a* through the connection line 326.

In one or more embodiments, the inert gas G1 includes a purge gas. In one or more embodiments, the first reactive gas R1 and the second reactive gas R2 each includes a deposition gas, a cleaning gas (e.g., for pre-cleaning the substrates 107 or cleaning components of the processing chamber 100), and/or an etching gas. The cleaning gas can include a plasma and/or atomic radicals. In one or more embodiments, the first reactive gas R1 is one of a deposition gas, an etching gas, or a cleaning gas, and the second reactive gas R2 is another of a deposition gas, an etching gas, or a cleaning gas.

Figure 4:
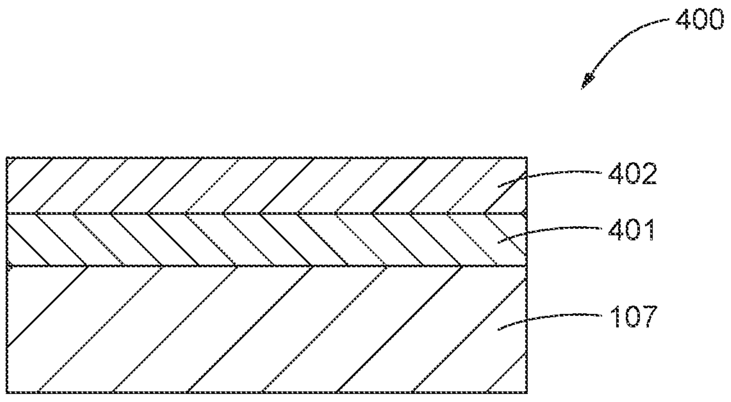
FIG. 4 is a schematic cross-sectional side view of a substrate structure formed using the method shown in FIGS. 3A-3D, according to one or more embodiments.

FIG. 4 is a schematic cross-sectional side view of a substrate structure 400 formed using the method shown in FIGS. 3A-3D, according to one or more embodiments. The first layer 401 is formed on the first side of the substrate 107, and the second layer 402 is formed on the first layer 401.

Figure 5:
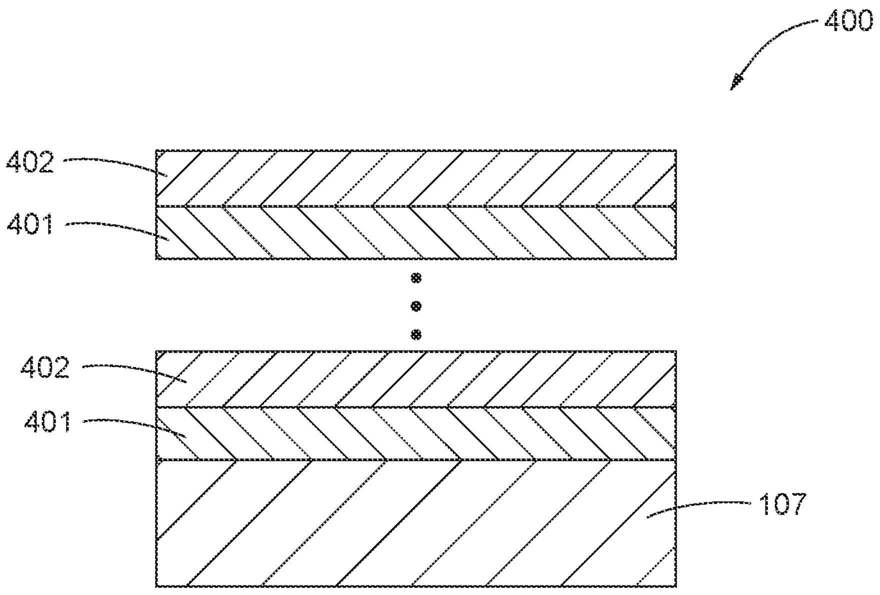
FIG. 5 is a schematic cross-sectional side view of a substrate structure formed using the method shown in FIGS. 3A-3D, according to one or more embodiments.

FIG. 5 is a schematic cross-sectional side view of a substrate structure 500 formed using the method shown in FIGS. 3A-3D, according to one or more embodiments. A plurality of first layers 401 and a plurality of second layers 402 are formed in an alternating arrangement on the first side of the substrate 107. The stacks of layers 401, 402 can be made by repeating the operations of FIGS. 3A-3D by one or more iterations. For example, after FIG. 3D, the substrates 107 can be moved upwardly back to the first position shown in FIG. 3A, and the operations of FIGS. 3A-3D can be repeated.

Figure 6:
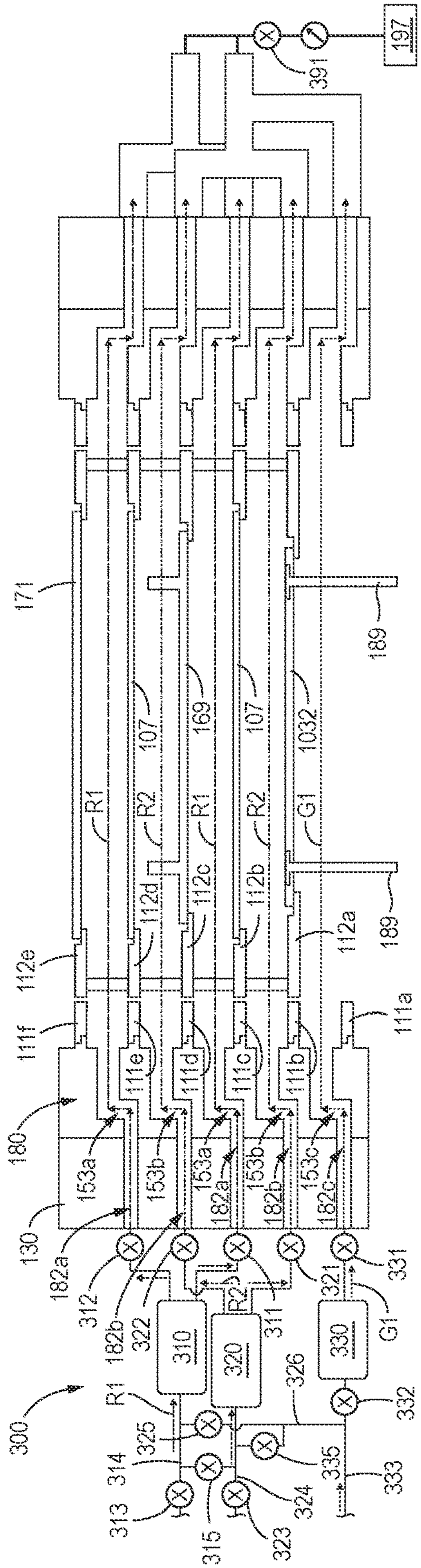
FIG. 6 is a schematic partial side cross-sectional view of the processing chamber and the gas circuit during a method of substrate processing, according to one or more embodiments.

FIG. 6 is a schematic partial side cross-sectional view of the processing chamber 100 and the gas circuit 300 during a method of substrate processing, according to one or more embodiments.

In FIG. 6, the first supply valve 313 and the first set of valves 311, 312 are open to supply the first reactive gas R1 through the first supply line 314 and the first flow controller 310, and the second supply valve 323 and the second set of valves 321, 322 are open to supply the second reactive gas R2 through the second supply line 324 and the second flow controller 320. The connection valve 315, the second connection valve 325, and the third connection valve 335 are closed, and the third supply valve 332 and the valve 331 are open to supply the inert gas G1 through the third supply line 333 and the third flow controller 330. The connection valve 315 is closed in FIG. 6.

The first set of flow levels 153*a* correspond respectively to first sides of the plurality of substrates 107, and the second set of flow levels 153*b* correspond respectively to second sides of the plurality of substrates 107. In one or more embodiments, the first reactive gas R1 in FIG. 6 respectively processes (e.g., by forming a layer, etching, or cleaning) first sides of the substrates 107, and the second gas flow R2 simultaneously respectively processes second sides of the substrates 107. In one or more embodiments, the first reactive gas R1 in FIG. 6 forms a first layer 801 (shown in FIG. 8) respectively on the first sides of the substrates 107, and the second gas flow R2 simultaneously forms a second layer 802 (shown in FIG. 8) respectively on the second sides of the substrates 107. In the implementation of FIG. 6, the first gas flow includes the first reactive gas R1 and the second gas flow includes the second reactive gas R2.

Figure 7A:
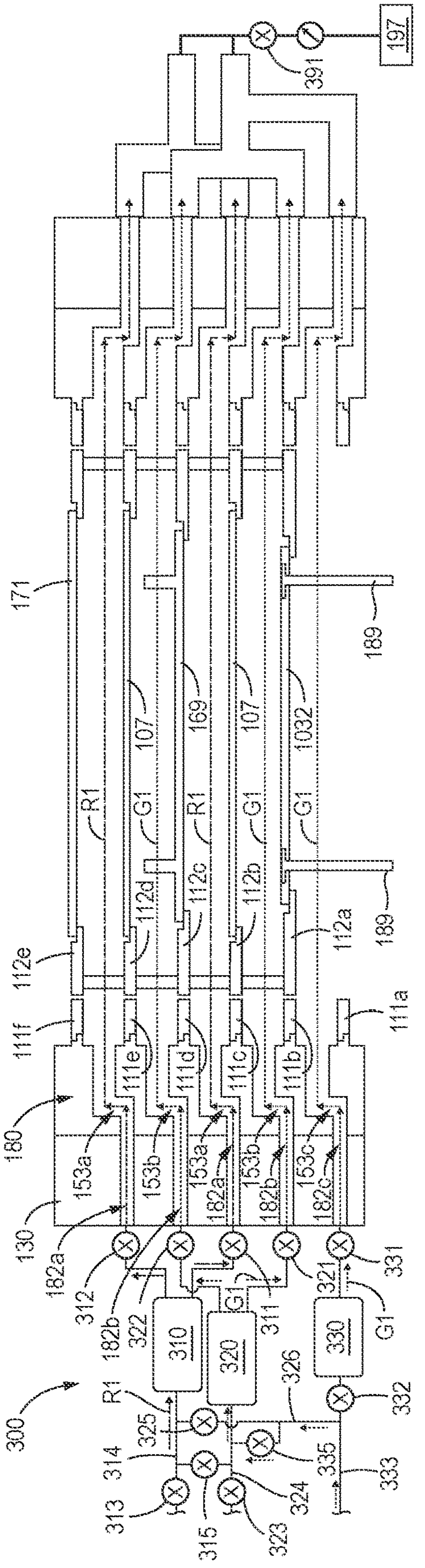
FIGS. 7A-7B are schematic partial side cross-sectional views of the processing chamber and a gas circuit during a method of substrate processing, according to one or more embodiments.
Figure 7B:
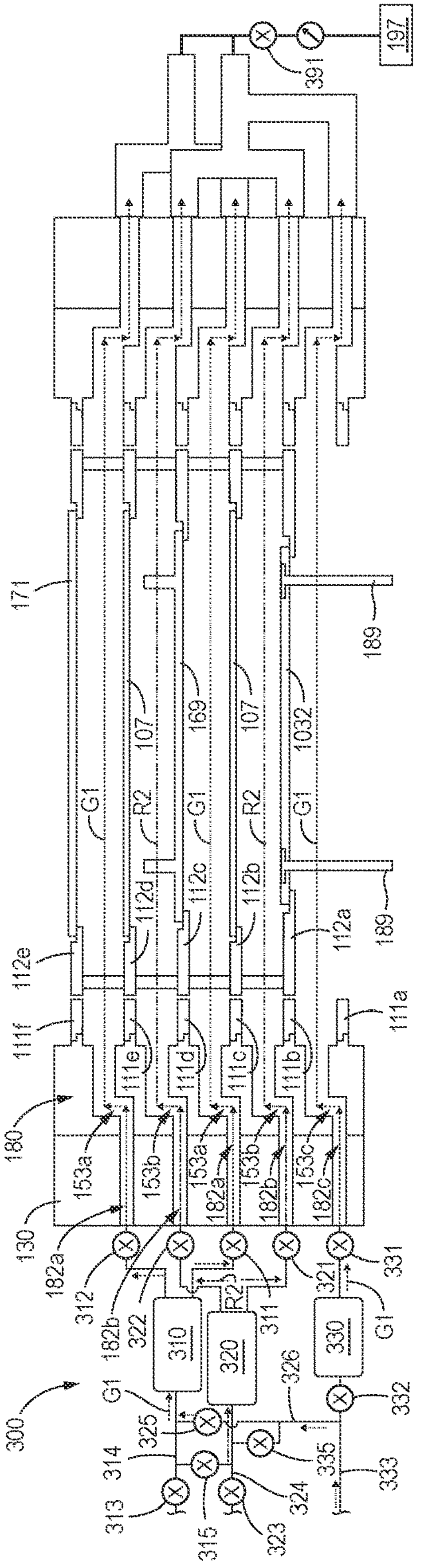

FIGS. 7A-7B are schematic partial side cross-sectional views of the processing chamber 100 and a gas circuit 300 during a method of substrate processing, according to one or more embodiments.

In FIG. 7A the first reactive gas R1 flows into to the first set of flow levels 153*a*, and the inert gas G1 simultaneously flows into the second set of flow levels 153*b* and a lower flow level 153*c*. In FIG. 7A the gas circuit 300 can be configured in a manner similar to FIG. 3A. In the implementation of FIG. 7A, the first gas flow includes the first reactive gas R1 and the second gas flow includes the inert gas G1.

In FIG. 7B the second reactive gas R2 flows into the second set of flow levels 153*b*, and the inert gas G1 simultaneously flows into the first set of flow levels 153*a* and the lower flow level 153*c*. The substrates 107 are in the first position in both of FIGS. 7A and 7B. In FIG. 7A the gas circuit 300 can be configured in a manner similar to FIG. 3C.

The gas circuit 300 can be configured in a manner similar to FIGS. 3B and 3D between FIGS. 7A and 7B and/or after FIG. 7B. As such, the inert gas G1 is supplied to the first set of flow levels 153*a*, the second set of flow levels 153*b*, and the lower flow level 153*c* while the substrates 107 are in the first position.

In one or more embodiments, the operations of FIG. 7A respectively process (e.g., by forming a layer, etching, or cleaning) first sides of the substrates 107 and the operations of FIG. 7B subsequently respectively process second sides of the substrates 107. In one or more embodiments, the operations of FIG. 7A form the first layer 801 (shown in FIG. 8) respectively on the first sides of the substrates 107 and the operations of FIG. 7B subsequently form the second layer 802 (shown in FIG. 8) respectively on the second sides of the substrates 107.

Figure 8:
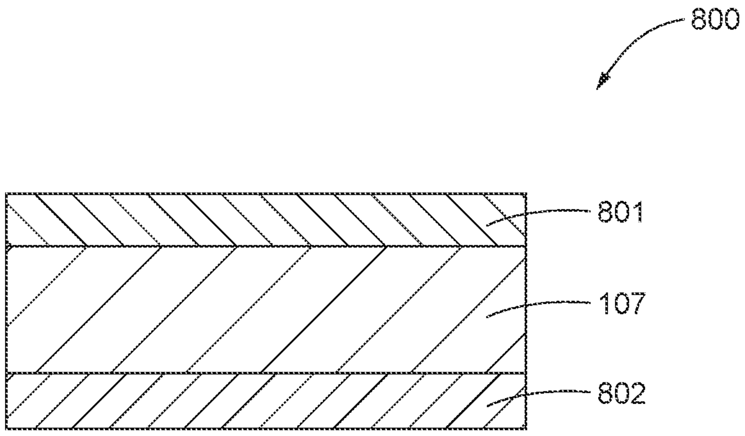
FIG. 8 is a schematic cross-sectional side view of a substrate structure formed using the method shown in FIG. 6 or the method shown in FIGS. 7A-7B, according to one or more embodiments.

FIG. 8 is a schematic cross-sectional side view of a substrate structure 800 formed using the method shown in FIG. 6 or the method shown in FIGS. 7A-7B, according to one or more embodiments.

Figure 9:
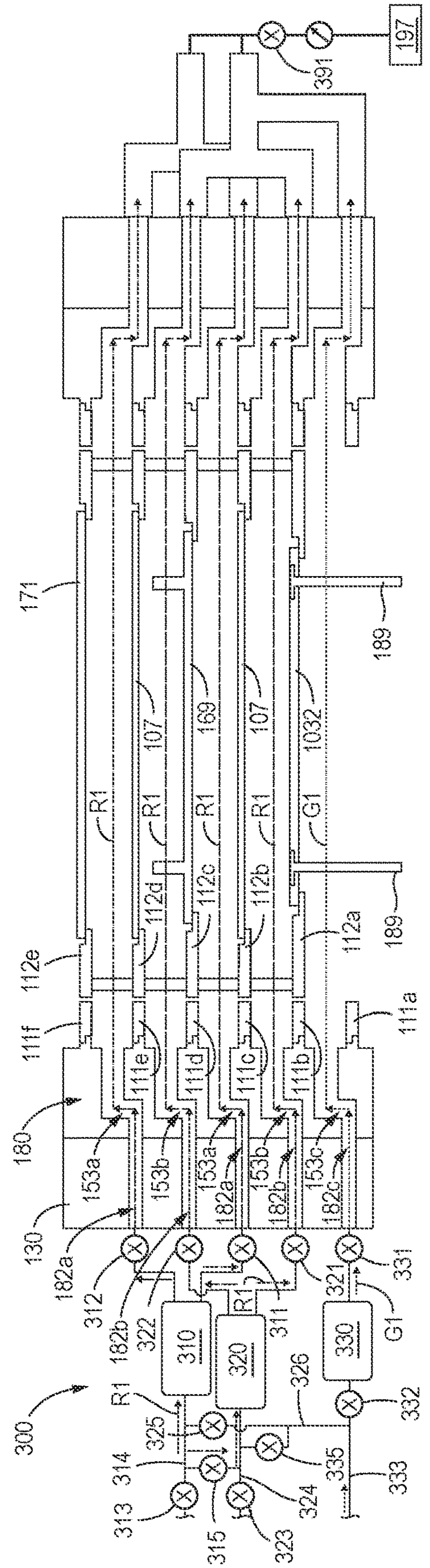
FIG. 9 is a schematic partial side cross-sectional view of the processing chamber and the gas circuit during a method of substrate processing, according to one or more embodiments.

FIG. 9 is a schematic partial side cross-sectional view of the processing chamber 100 and the gas circuit 300 during a method of substrate processing, according to one or more embodiments.

In FIG. 9, the first gas flow including the first reactive gas R1 is simultaneously supplied to the first set of flow levels 153*a* and the second set of flow levels 153*b*. The first supply valve 313 along the first supply line 314 is opened to supply the first gas flow (including the first reactive gas R1) to the first set of flow levels 153*a*, the second supply valve 323 along the second supply line 324 is closed, and the connection valve 315 between the first supply line 314 and the second supply line 324 is opened to supply the first gas flow (including the first reactive gas R1) to the second set of flow levels 153*b*.

Figure 10:
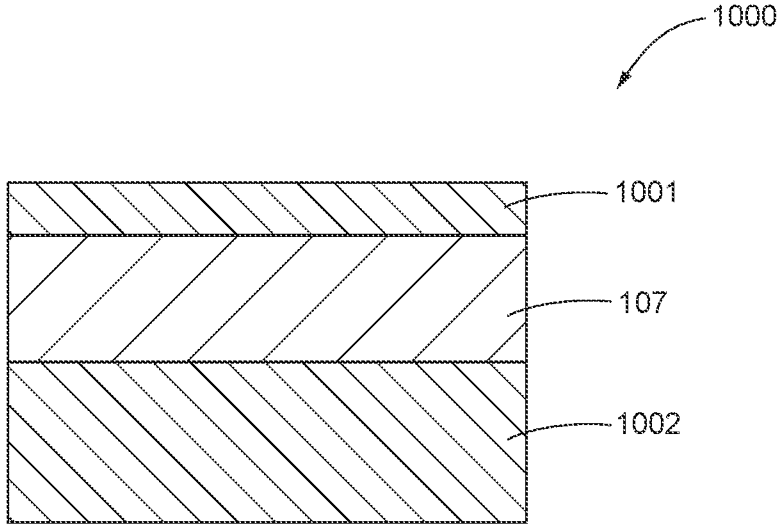
FIG. 10 is a schematic cross-sectional side view of a substrate structure formed using the method shown in FIG. 9, according to one or more embodiments.

FIG. 10 is a schematic cross-sectional side view of a substrate structure 1000 formed using the method shown in FIG. 9, according to one or more embodiments. A first layer 1001 is formed on first side of the substrate 107, and a second layer 1002 is formed on a second side of the substrate 107. The second layer 1002 can have the same composition as the first layer 1001. The second layer 2002 can have the same thickness or a different thickness than the first layer 1001.

Figure 11:
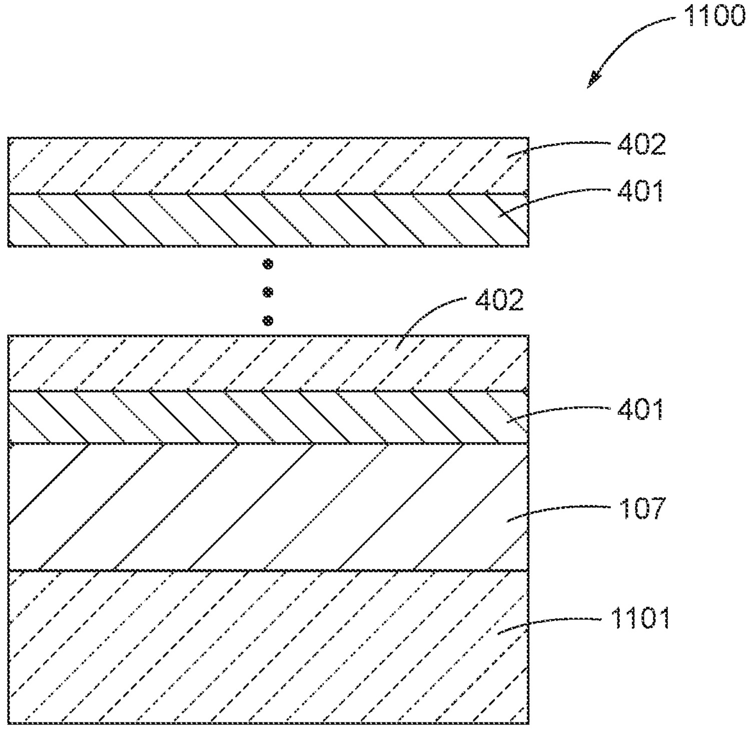
FIG. 11 is a schematic cross-sectional side view of a substrate structure, according to one or more embodiments.

FIG. 11 is a schematic cross-sectional side view of a substrate structure 1100, according to one or more embodiments.

The substrate structure 1100 is formed by first conducting the operations of FIG. 6 or the operations of FIGS. 7A-7B to form the first layer 401 on the first side of the substrate 107, and a layer 1101 on the second side of the substrate 107. The operations of FIGS. 3C-3D can then be conducted to form the second layer 402 on the first layer 401. The operations of FIGS. 3A-3D can then be conducted one or more times to form one or more stacks of the first and second layers 401, 402 on the second layer 402. The layer 1101 can have the same composition as the second layer 402. The layer 1101 can have the same thickness or a different thickness than the second layers 402.

Figure 12:
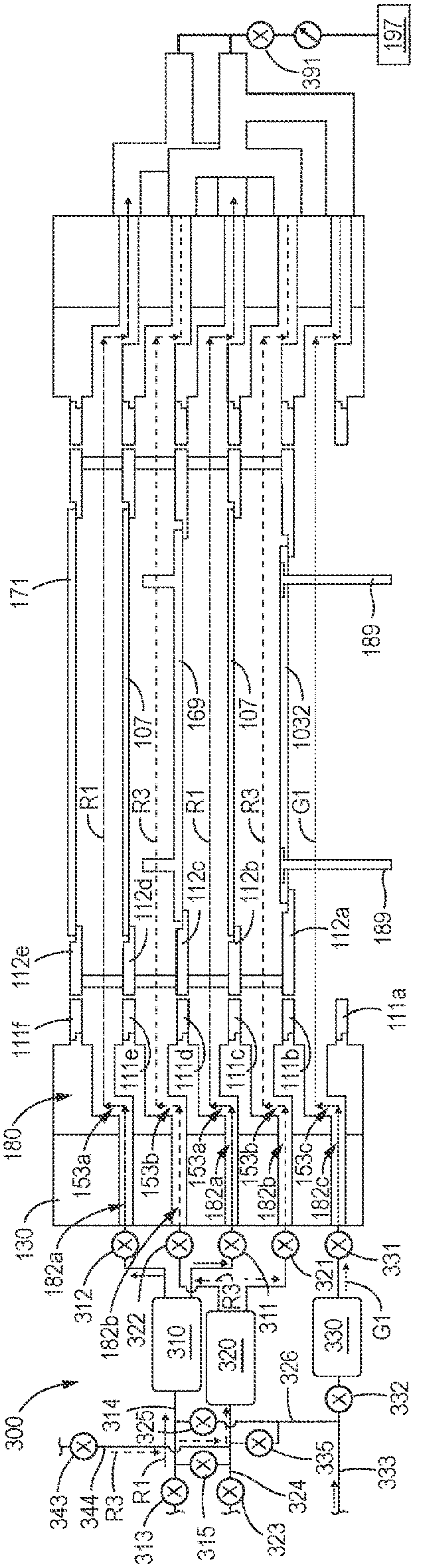
FIG. 12 is a schematic partial side cross-sectional view of the processing chamber and the gas circuit during a method of substrate processing, according to one or more embodiments.

FIG. 12 is a schematic partial side cross-sectional view of the processing chamber 100 and the gas circuit 300 during a method of substrate processing, according to one or more embodiments.

The gas circuit 300 also includes a fourth supply valve 343 and a fourth supply line 344 in fluid communication with the second flow controller 320. The first gas flow including the first reactive gas R1 respectively processes (e.g., by forming a layer, etching, or cleaning) the first sides of the plurality of substrates 107, and a second gas flow from the fourth supply valve 343 and the fourth supply line 344 includes a second reactive gas R3 that respectively processes the second sides of the plurality of substrates 107. In one or more embodiments, the first gas flow including the first reactive gas R1 forms the first layer 401 respectively on the first sides of the plurality of substrates 107, and the second gas flow from the fourth supply valve 343 and the fourth supply line 344 includes the second reactive gas R3 that forms a second layer 1301 (shown in FIG. 13) respectively on the second sides of the plurality of substrates 107.

Figure 13:
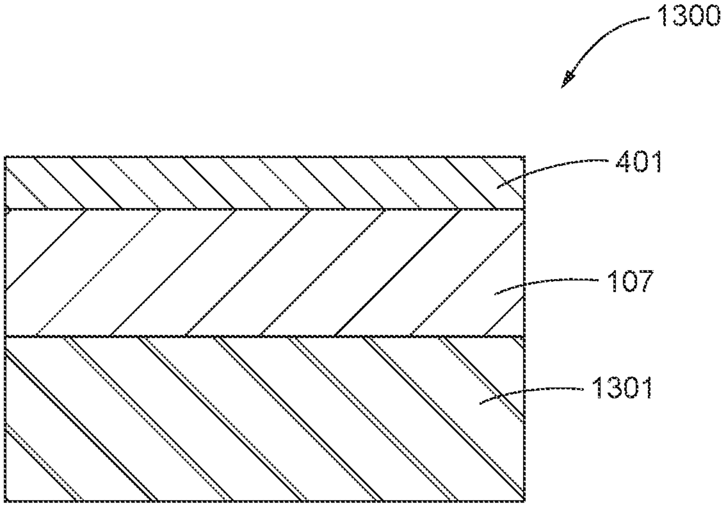
FIG. 13 is a schematic cross-sectional side view of a substrate structure formed using the method shown in FIG. 12, according to one or more embodiments.

FIG. 13 is a schematic cross-sectional side view of a substrate structure 1300 formed using the method shown in FIG. 12, according to one or more embodiments.

The first layer 401 has a first composition and the second layer 1301 has a second composition different than the first composition.

Figure 14:
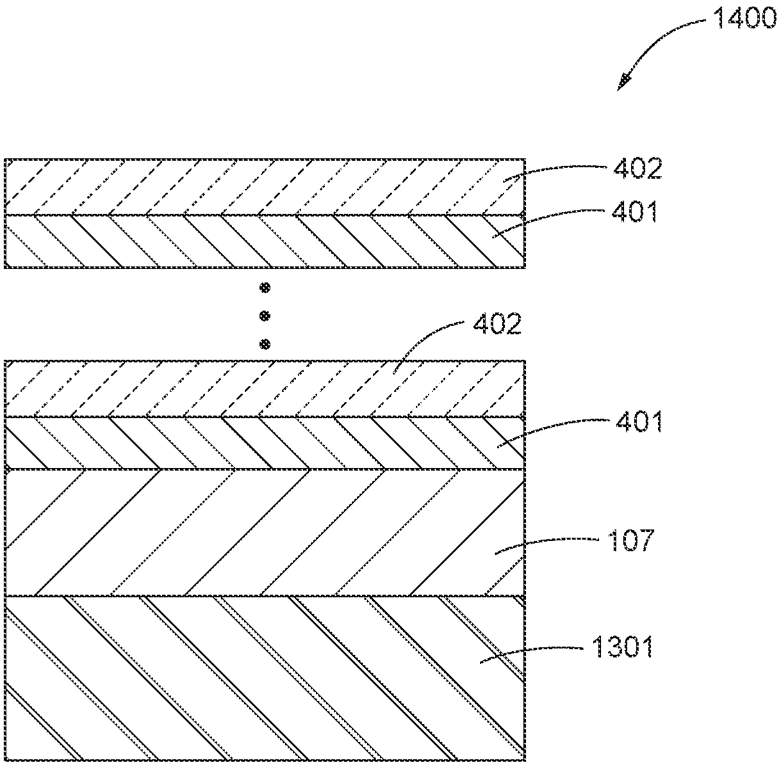
FIG. 14 is a schematic cross-sectional side view of a substrate structure, according to one or more embodiments.

FIG. 14 is a schematic cross-sectional side view of a substrate structure 1400, according to one or more embodiments.

The substrate structure 1400 is formed by first conducting the operations of FIG. 12 to form the first layer 401 and the second layer 1301. The operations of FIGS. 3C-3D (using reactive gas R2, which can be referred to as a third reactive gas) can then be conducted to form layer 402 (which can be referred to as a third layer) on the first layer 401. The operations of FIGS. 3A-3D can then be conducted one or more times to form one or more stacks of the first and third layers 401, 402 on the third layer 402. The second layer 1301 can have a different composition than the first layers 401 and the third layers 402

FIGS. 15A-15F are schematic partial side cross-sectional views of the processing chamber 100 and the gas circuit 300 during a method of substrate processing.

In the implementations shown in FIGS. 15A-15F, the positions of the first set of flow levels 153*a* and the second set of flow levels 153*b* are swapped with each other relative to the positions shown in FIGS. 3A-3D. In the implementations shown in FIGS. 15A-15F, the positions of the first set of valves 311, 312, the first flow controllers 310, the first supply valve 313, and the first supply line 314 are swapped with the positions of the second set of valves 321, 322, the second flow controllers 320, the second supply valve 323, and the second supply line 324 relative to the positions shown in FIGS. 3A-3D.

Figure 15A:
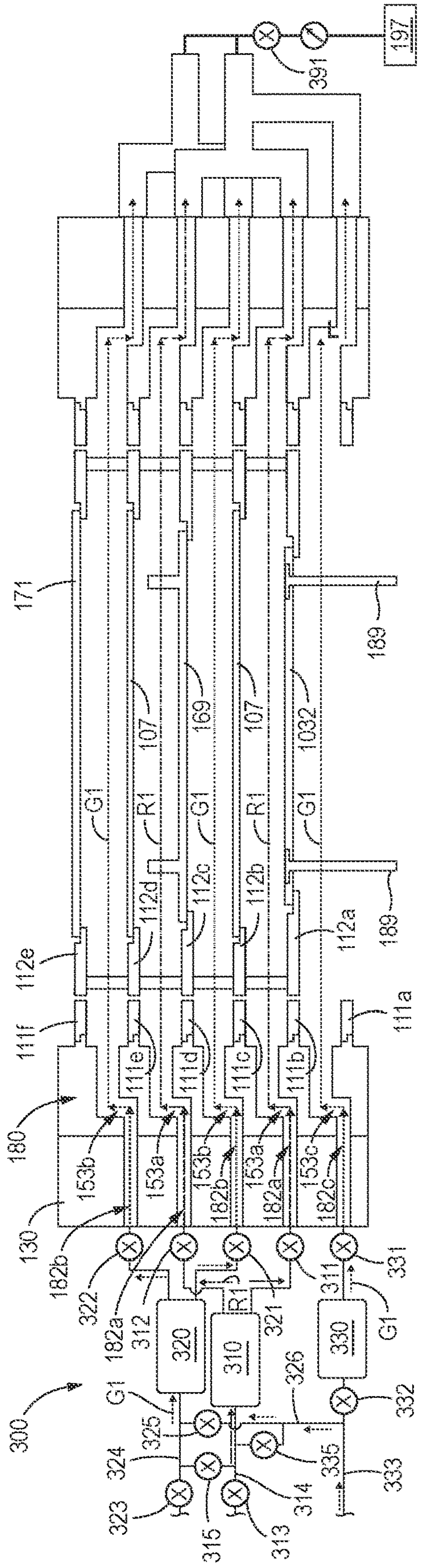
FIGS. 15A-15F are schematic partial side cross-sectional views of the processing chamber and the gas circuit during a method of substrate processing.

In FIG. 15A, the first gas flow including the first reactive gas R1 flows into the first set of flow levels 153*a* through the first flow controller 310, and the second gas flow including the inert gas G1 flows into the second set of flow levels 153*b* through the second flow controller 320.

Figure 15B:
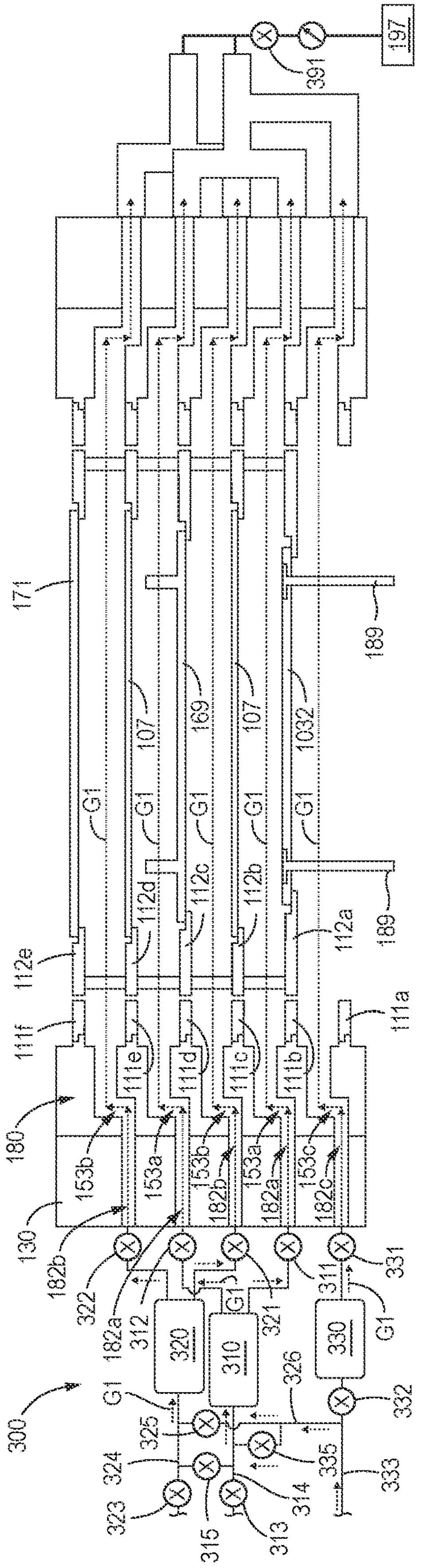

In FIG. 15B, the first reactive gas R1 flow is halted, and the inert gas G1 flows into the first set of flow levels 153*a* through the first flow controller 310 simultaneously with the flow of the inert gas G1 into the second set of flow levels 153*b*.

In FIGS. 15A and 15B the substrates 107 are in the first position (e.g., the upper position).

Figure 15C:
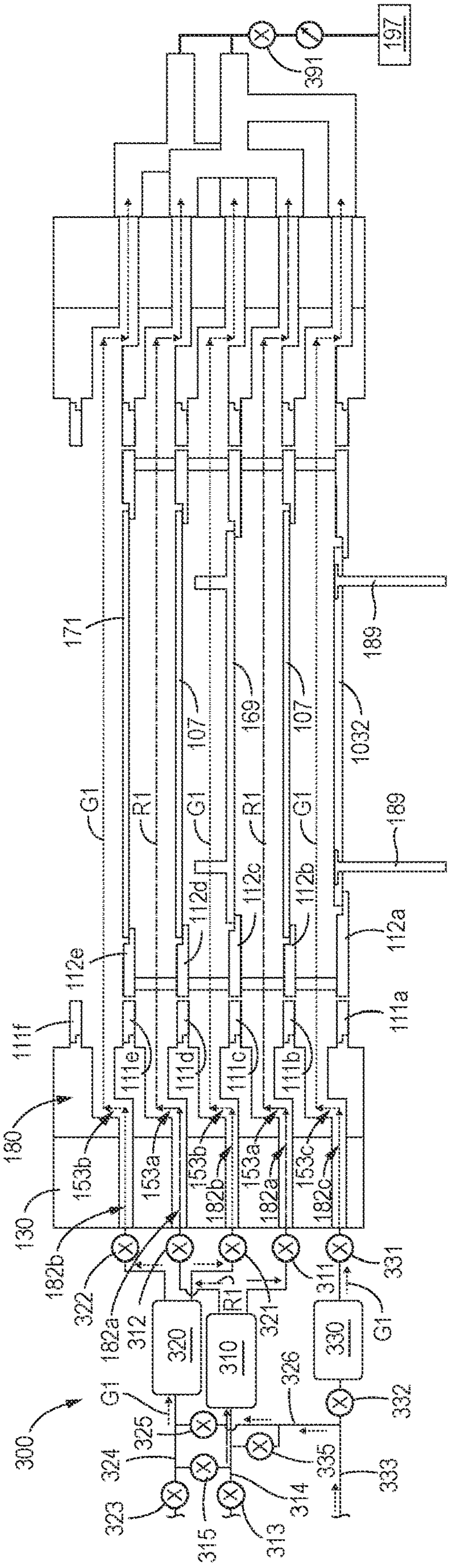

In FIG. 15C, the substrates 107 are moved from the first position and to the second position (e.g., the lower position). In FIG. 15C, the flow of the first gas flow including the first reactive gas R1 into the first set of flow levels 153A is repeated, and the second gas flow including the inert gas G1 continues to flow into the second set of flow levels 153*b* through the second flow controller 320.

The first set of flow levels 153*a* correspond respectively to first sides (lower sides in FIGS. 15A, 15B, 15E, and 15F) of the plurality of substrates 107 when in the first position, and the first set of flow levels 153*a* correspond respectively to second sides (upper sides in FIGS. 15C and 15D) of the plurality of substrates 107 when in the second position. The first reactive gas R1 respectively processes (e.g., by forming a layer, etching, or cleaning) the first sides and the second sides of the plurality of substrates 107 when respectively in the first position and the second position. In one or more embodiments, the first reactive gas R1 forms a first layer

401, 1601 (shown in FIG. 16) respectively on the first sides and the second sides of the plurality of substrates 107 when respectively in the first position and the second position.

Figure 15D:
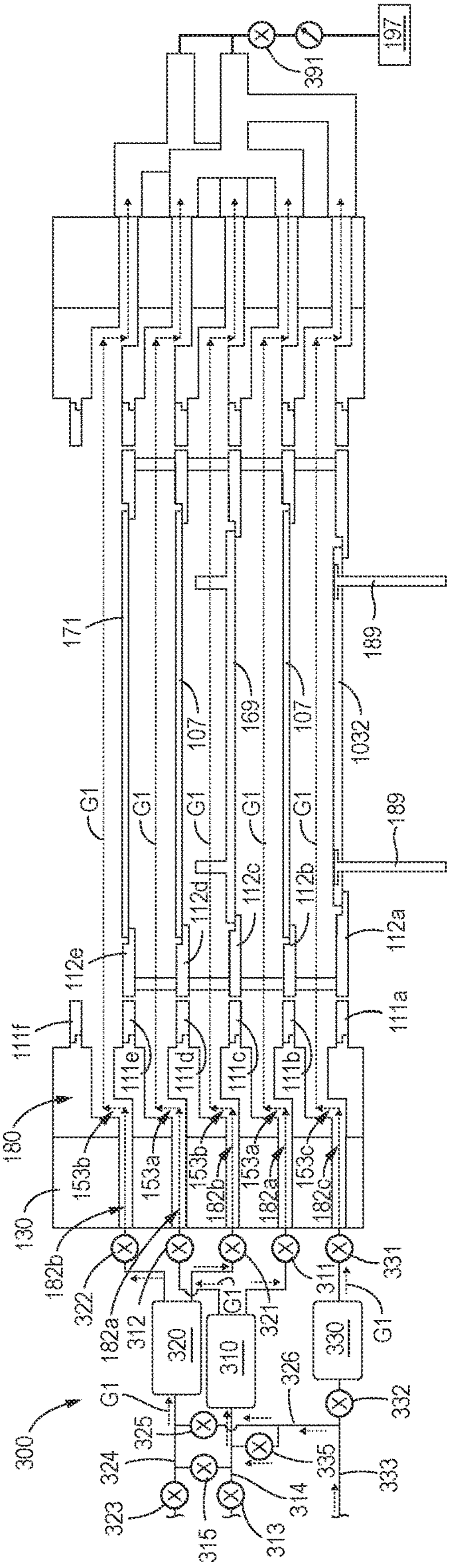

In FIG. 15D, the first reactive gas R1 flow is halted, and the inert gas G1 flows into the first set of flow levels 153*a* through the first flow controller 310 simultaneously with the flow of the inert gas G1 into the second set of flow levels 153*b*.

Figure 15E:
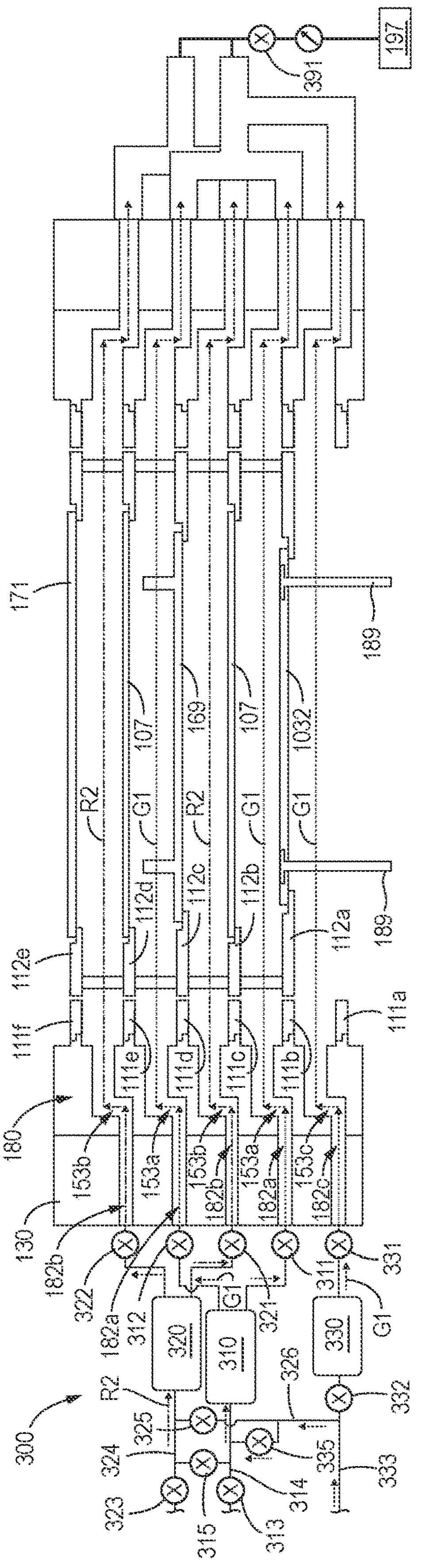

In FIG. 15E, the substrates are moved from the second position and back to the first position, and the second reactive gas R2 flows into the second set of flow levels 153*b*. The inert gas G1 flows into the first set of flow levels 153*a* simultaneously with the flowing of the second reactive gas R2.

Figure 15F:
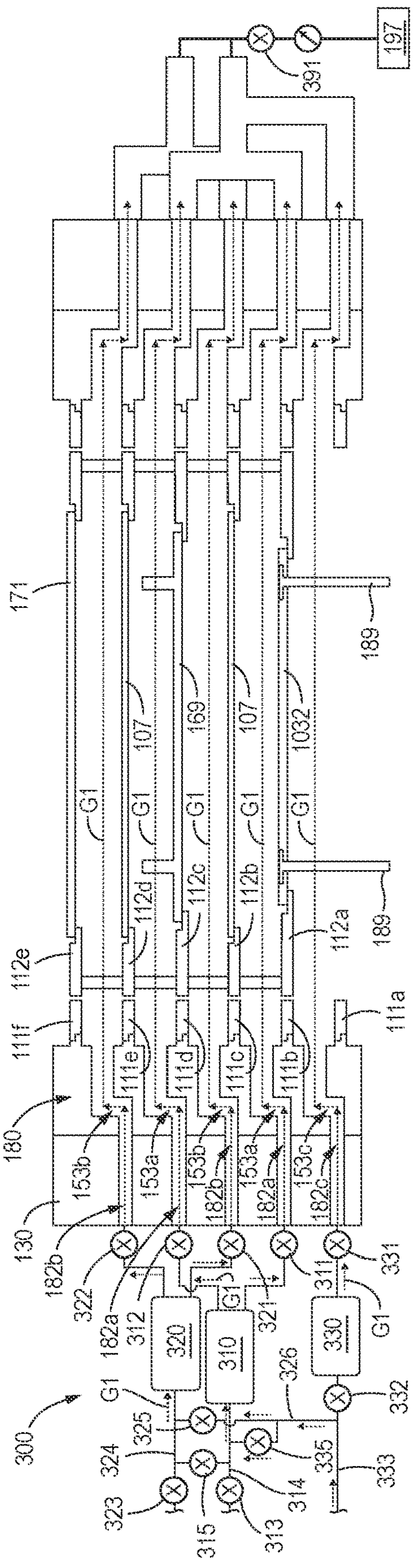

In FIG. 15F, the second reactive gas R2 flow is halted, and the inert gas G1 flows into the second set of flow levels 153*b* through the second flow controller 320 simultaneously with the flow of the inert gas G1 into the first set of flow levels 153*a*.

Figure 16:
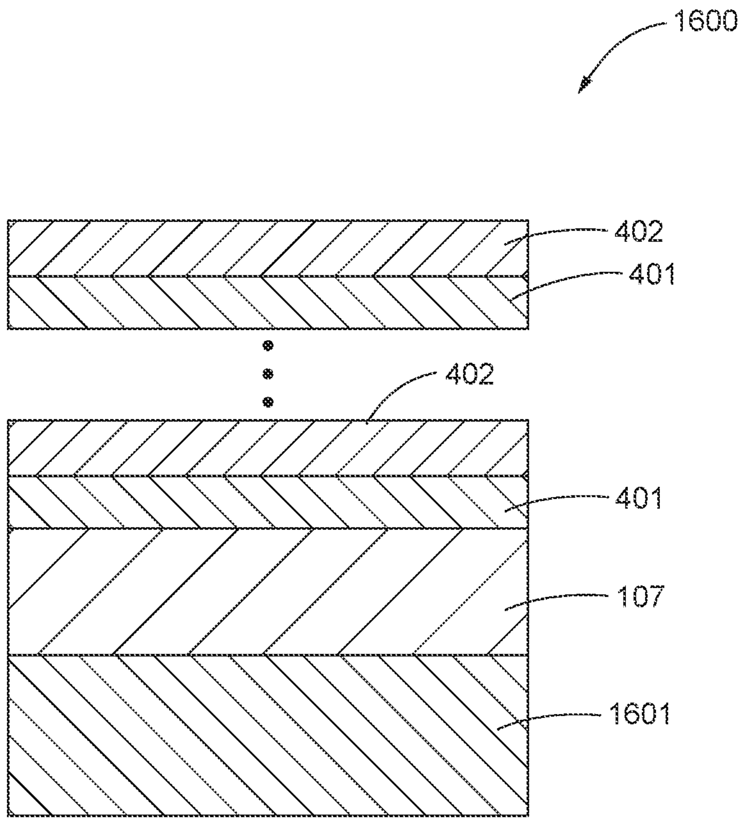
FIG. 16 is a schematic cross-sectional side view of a substrate structure, according to one or more embodiments.

FIG. 16 is a schematic cross-sectional side view of a substrate structure 1600, according to one or more embodiments.

The substrate structure 1600 is formed by first conducting the operations of FIG. 15A to form the first layer 1601 on the first side of the substrate 107 and the operations of FIG. 15C to form the first layer 401 on the second side of the substrate 107. The operations of FIG. 15E can then be conducted to form the second layer 402 on the first layer 401. The operations of FIGS. 15C and 15E can then be conducted one or more times to form one or more stacks of the first and second layers 401, 402 on the second layer 402. The first layer 1601 can have the same composition as the first layers 401. The first layer 1601 can have the same thickness or a different thickness than the first layers 401. The present disclosure contemplates that the operations of FIG. 15A and FIG. 15B can be omitted such that the first layer 1601 can be omitted.

FIGS. 17A-17F are schematic partial side cross-sectional views of the processing chamber 100 and the gas circuit 300 during a method of substrate processing.

Figure 17A:
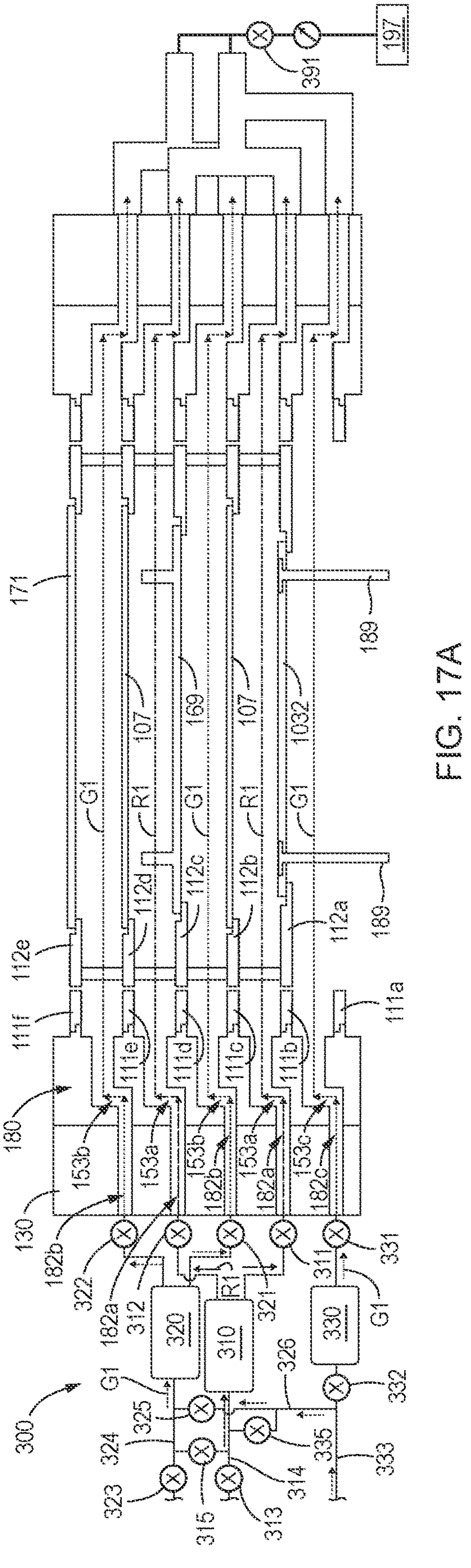
FIGS. 17A-17F are schematic partial side cross-sectional views of the processing chamber and the gas circuit during a method of substrate processing.

In FIG. 17A the first gas flow including the first reactive gas R1 flows into to the first set of flow levels 153*a* through the first flow controllers 310, and the second gas flow including the inert gas G1 simultaneously flows into the second set of flow levels 153*b* and the lower flow level 153*c* through the second flow controller 320 and the third flow controller 330. In FIG. 17A the gas circuit 300 can be configured in a manner similar to FIG. 15A.

Figure 17B:
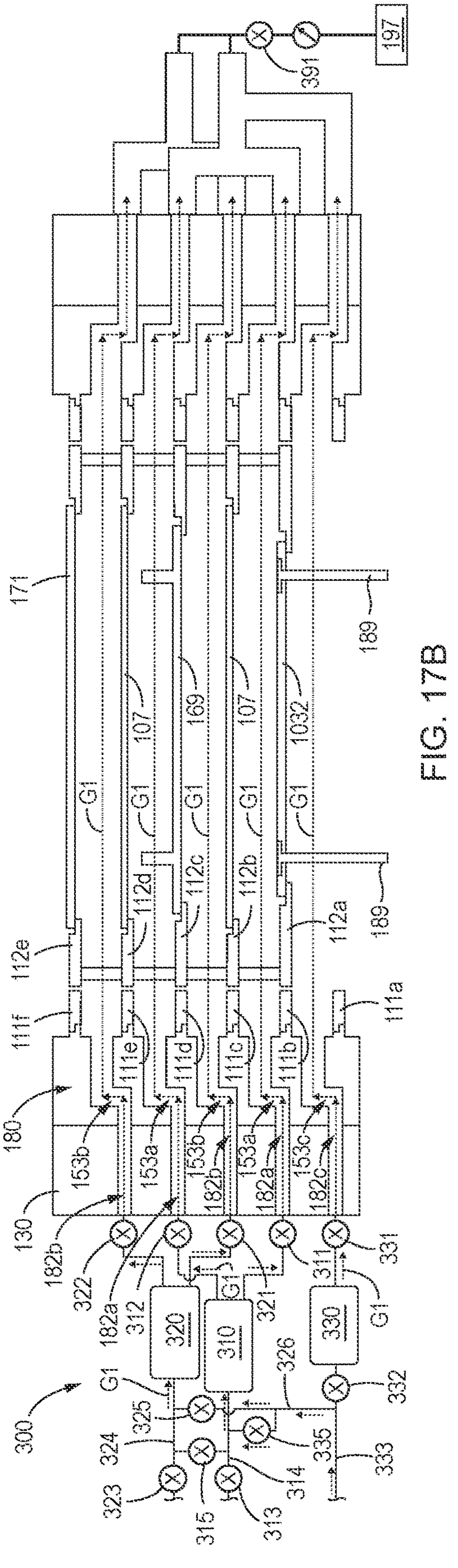

In FIG. 17B, the first reactive gas R1 flow is halted, and the inert gas G1 flows into the first set of flow levels 153*a* through the first flow controller 310 simultaneously with the flow of the inert gas G1 into the second set of flow levels 153*b*.

In FIGS. 17A and 17B the substrates 107 are in the first position (e.g., the upper position).

Figure 17C:
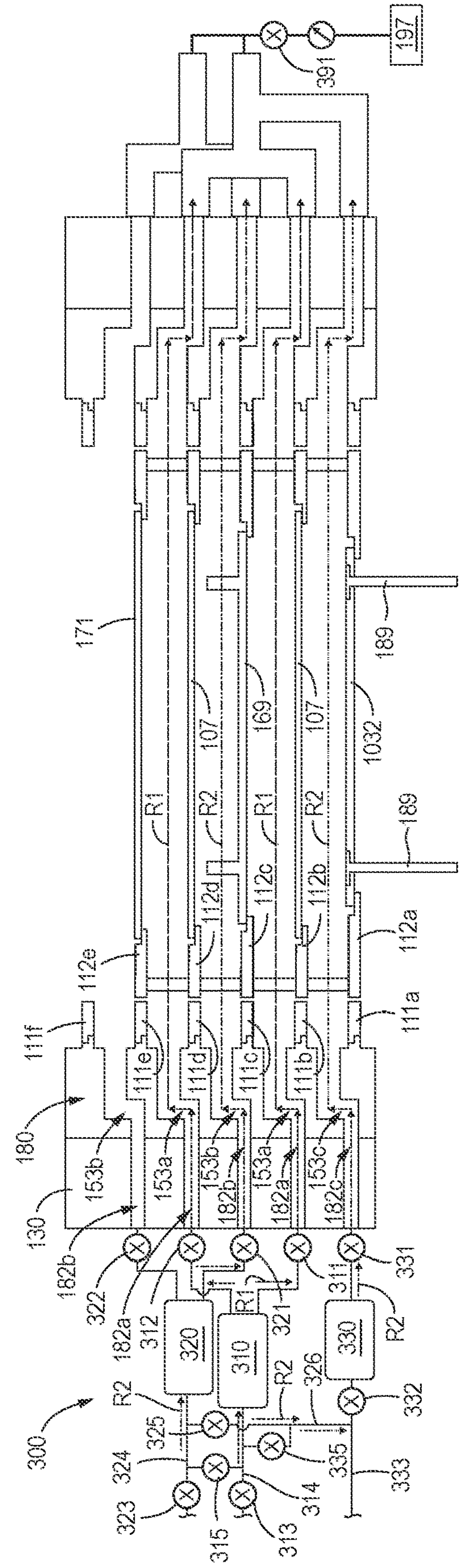

In FIG. 17C, the substrates 107 are moved from the first position and to the second position (e.g., the lower position). In FIG. 17C, the flow of the first gas flow including the first reactive gas R1 into the first set of flow levels 153A is repeated.

The second reactive gas R2 flows into a first subset (e.g., the lower flow level 153*b*) of the second set of flow levels 153*b* simultaneously with the flowing of the first gas flow including the first reactive gas R1. The second reactive gas R2 also flows into the lower flow level 153*c* through the second connection valve 325, the third flow controller 330, and the valve 331. The first subset can include one or more flow levels 153*b*. In the implementation of FIG. 17C, the first subset includes the flow level 153*b* between the first set of flow levels 153*a*. The inert gas G1 can optionally flow into a second subset (e.g., the upper flow level 153*b*) of the second set of flow levels 153*b*.

The first set of flow levels 153*a* correspond respectively to first sides (lower sides in FIGS. 17A, 17B, 17E, and 17F) of the plurality of substrates 107 when in the first position, and the first set of flow levels 153*a* correspond respectively to second sides (upper sides in FIGS. 17C and 17D) of the plurality of substrates 107 when in the second position. The first reactive gas R1 respectively processes (e.g., by forming a layer, etching, or cleaning) the first sides and the second sides of the plurality of substrates 107 when respectively in the first position and the second position. In one or more embodiments, the first reactive gas R1 forms a first layer 401, 1801 (shown in FIG. 18) respectively on the first sides and the second sides of the plurality of substrates 107 when respectively in the first position and the second position. When in the second position the second reactive gas R2 respectively processes the first sides (such as the first layers 1801 on the first sides, if used) of the plurality of substrates 107. In one or more embodiments, when in the second position the second reactive gas R2 forms a second layer 1802 respectively on the first layers 1801 on the first sides of the plurality of substrates 107.

Figure 17D:
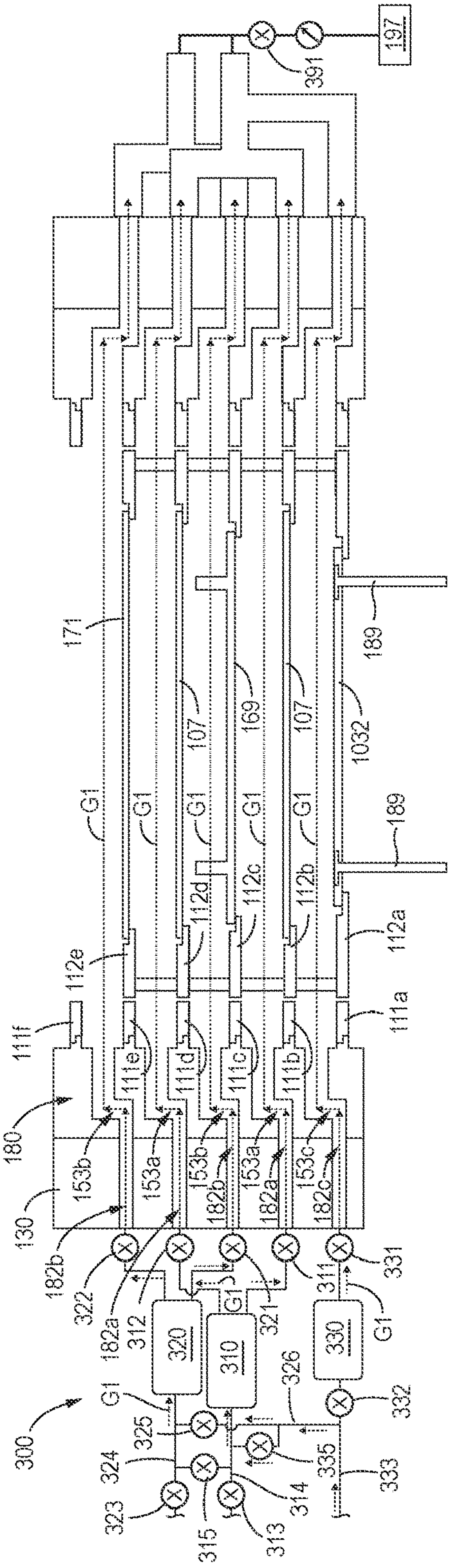

In FIG. 17D, the first reactive gas R1 flow and the second reactive gas R2 flow are halted, and the inert gas G1 flows into the first set of flow levels 153*a* through the first flow controller 310 simultaneously with the flow of the inert gas G1 into the second set of flow levels 153*b*.

Figure 17E:
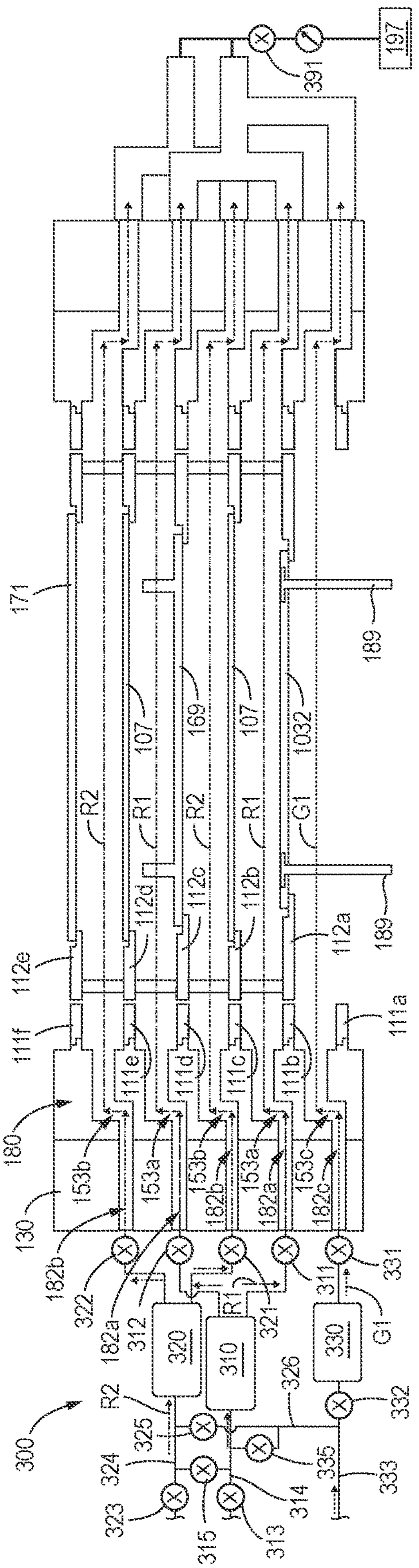

In FIG. 17E, the substrates are moved from the second position and back to the first position, the first reactive gas R1 flow into the first set of flow levels 153*a* is repeated, and the second reactive gas R2 flows into the second set of flow levels 153*b* simultaneously with the flow of the first reactive gas R1. The second reactive gas R2 flows into a second subset (e.g., the flow level 153*b* between the first set of flow levels 153*a*) of the second set of flow levels 153*b* simultaneously with the flowing of the first gas flow including the first reactive gas R1. The second reactive gas R2 also flows into the uppermost flow level 153*b* of the second set. The inert gas G1 flows into the lower flow level 153*c*.

Figure 17F:
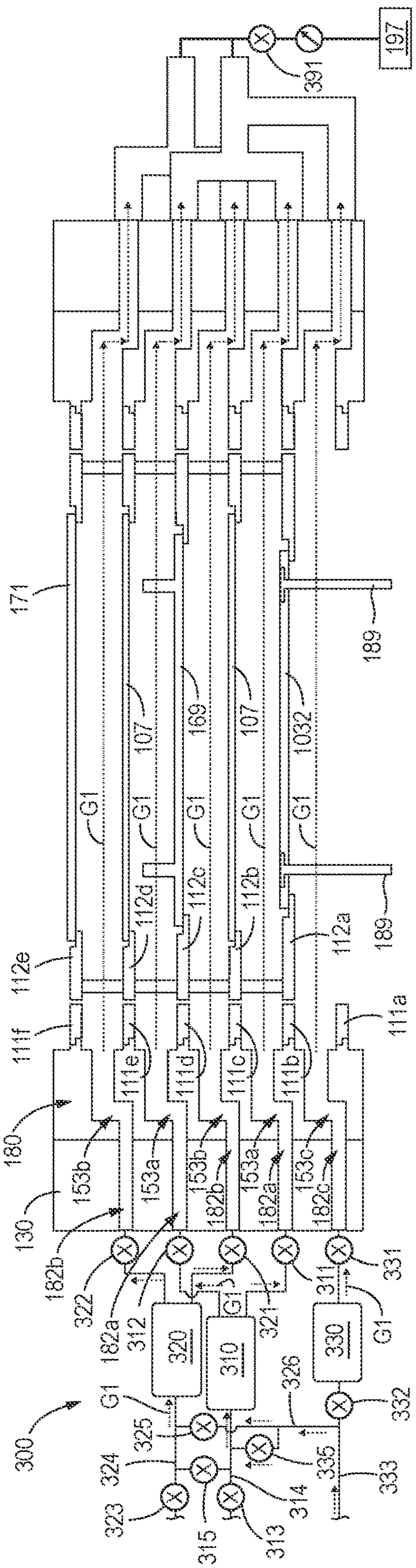

In FIG. 17F, the first reactive gas R1 flow and the second reactive gas R2 flow is halted, and the inert gas G1 flows into the second set of flow levels 153*b* through the second flow controller 320 simultaneously with the flow of the inert gas G1 into the first set of flow levels 153*a* through the first flow controller 310.

Figure 18:
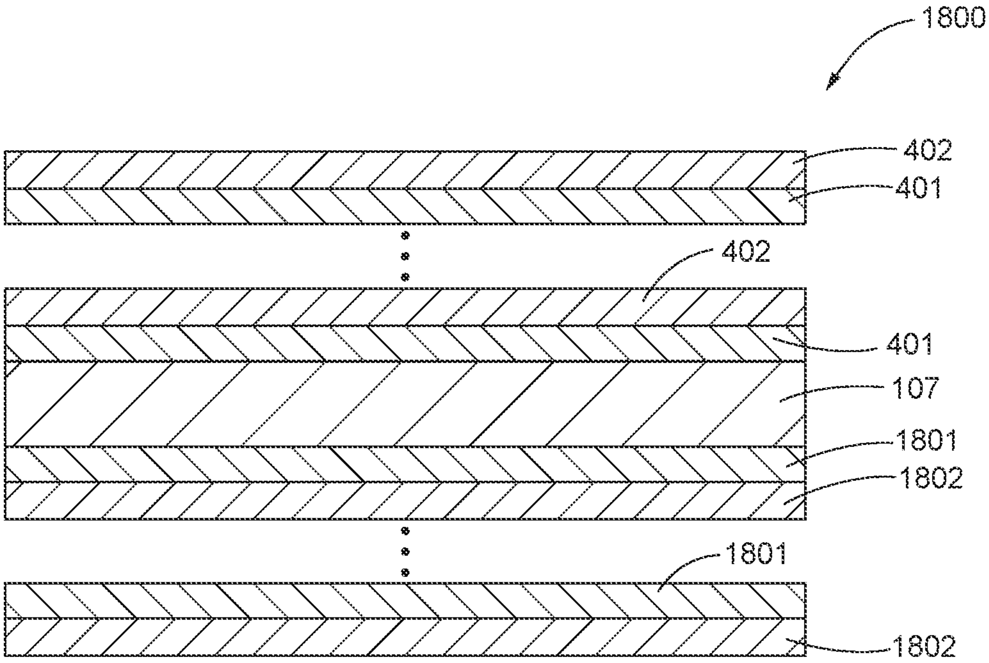
FIG. 18 is a schematic cross-sectional side view of a substrate structure, according to one or more embodiments.

FIG. 18 is a schematic cross-sectional side view of a substrate structure 1800, according to one or more embodiments.

The substrate structure 1800 is formed by first conducting the operations of FIG. 17A to form the first layer 1801 on the first side of the substrate 107 and the operations of FIG. 17C to form the first layer 401 on the second side of the substrate 107 and the second layer 1802 on the first layer 1801 (on the first side of the substrate 107). The operations of FIG. 17E can then be conducted to form the second layer 402 on the first layer 401 (on the second side of the substrate 107) and another first layer 1801 on the second layer 1802 (on the first side of the substrate 107). The operations of FIGS. 17C and 17E can then be repeated one or more times to form one or more additional stacks of the first and second layers 401, 402 on the second side, and one or more additional stacks of the first and second layers 1801, 1802 on the first side. The first layers 1801 can have the same composition as the first layers 401 and/or the second layers 1802 can have the same composition as the second layers 1802. The first layer 1801 can have the same thickness or a different thickness than the first layers 401 and/or the second layers 1802 can have the same thickness or a different thickness than the second layers 402.

Figure 19:
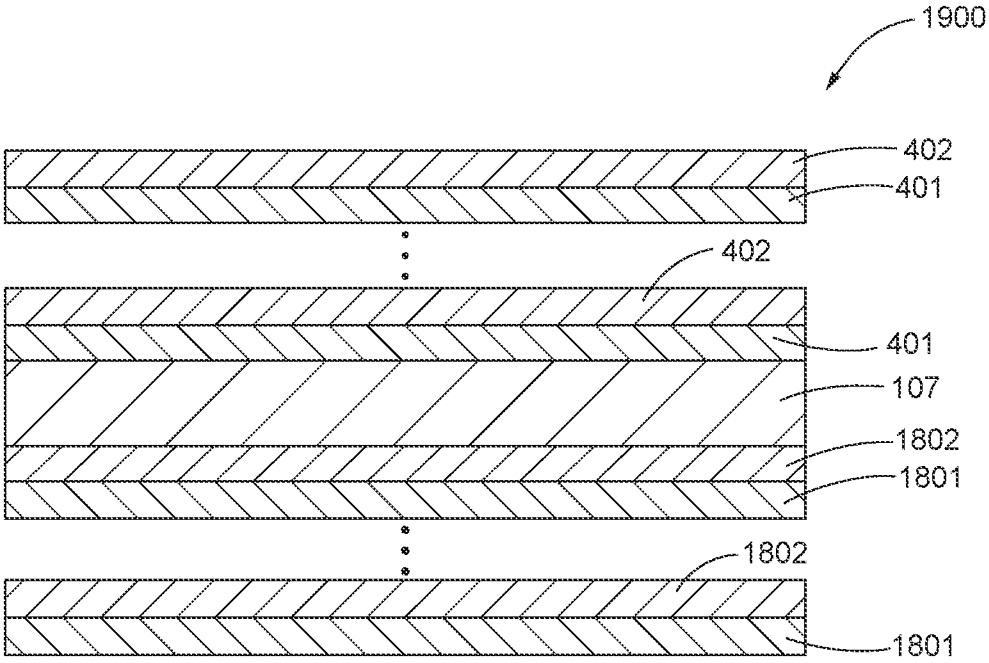
FIG. 19 is a schematic cross-sectional side view of a substrate structure, according to one or more embodiments.

FIG. 19 is a schematic cross-sectional side view of a substrate structure 1900, according to one or more embodiments.

The substrate structure 1900 is formed by conducting the operations of FIGS. 17C and 17E while omitting the operations of FIG. 17A. For example, in FIG. 17C the first gas flow including the first reactive gas R1 flows into the first set of flow levels 153*a* and the second gas flow including the second reactive gas R2 flows into the second set of flow levels 153*b*. In FIG. 17E the substrates 107 move from a first position (e.g., a lower position in FIG. 17C) to a second position (e.g., an upper position in FIG. 17E). In FIG. 17E the flowing of the first gas flow into the first set of flow levels 153*a* is repeated, and the second gas flow flows into a subset (e.g., the flow level 153*b* between the first set of flow levels 153*a*) of the second set of flow levels 153*b* simultaneously with the first gas flow. The second reactive gas R2 also flows into the uppermost flow level 153*b* of the second set.

The operations of FIGS. 17C and 17E can be repeated one or more times to form one or more additional stacks of the first and second layers 401, 402 and the first and second layers 1801, 1802.

Figure 20:
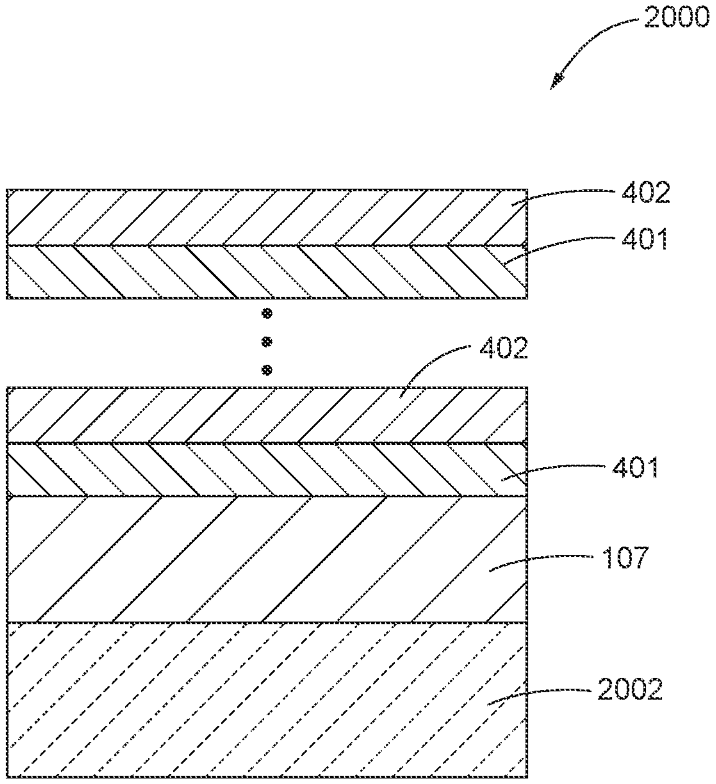
FIG. 20 is a schematic cross-sectional side view of a substrate structure, according to one or more embodiments.

FIG. 20 is a schematic cross-sectional side view of a substrate structure 2000, according to one or more embodiments.

The substrate structure 2000 is formed by first conducting the operations of FIG. 6 or the operations of FIGS. 7A and 7B to form a layer 2002 on the first side of the substrate 107 and a first layer 401 on the second side of the substrate 107, and then the operations of FIG. 3C to form the second layer 402 on the first layer 401 that is on the second side of the substrate 107. For example, the substrates 107 can move from a first position (e.g., the upper position) of FIG. 6 or FIGS. 7A-7B and to a second position (e.g., the lower position) FIG. 3C.

The operations of FIGS. 3A-3D can then be conducted one or more times to form one or more stacks of the first and second layers 401, 402 on the second layer 402. The layer 2002 can have the same composition as the second layers 402. The layer 2002 can have the same thickness or a different thickness than the second layers 402.

Figure 21A:
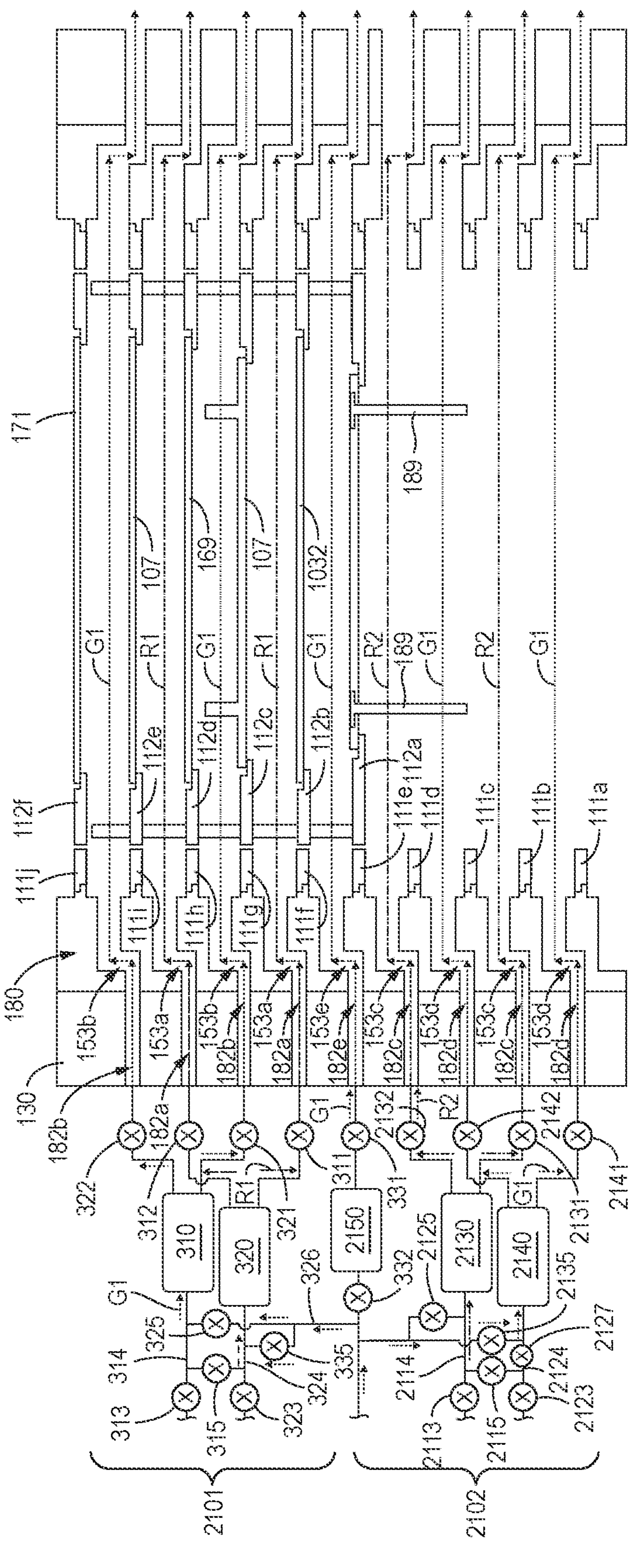
FIGS. 21A-21B are schematic partial side cross-sectional views of the processing chamber and a gas circuit during a method of substrate processing, according to one or more embodiments.
Figure 21B:
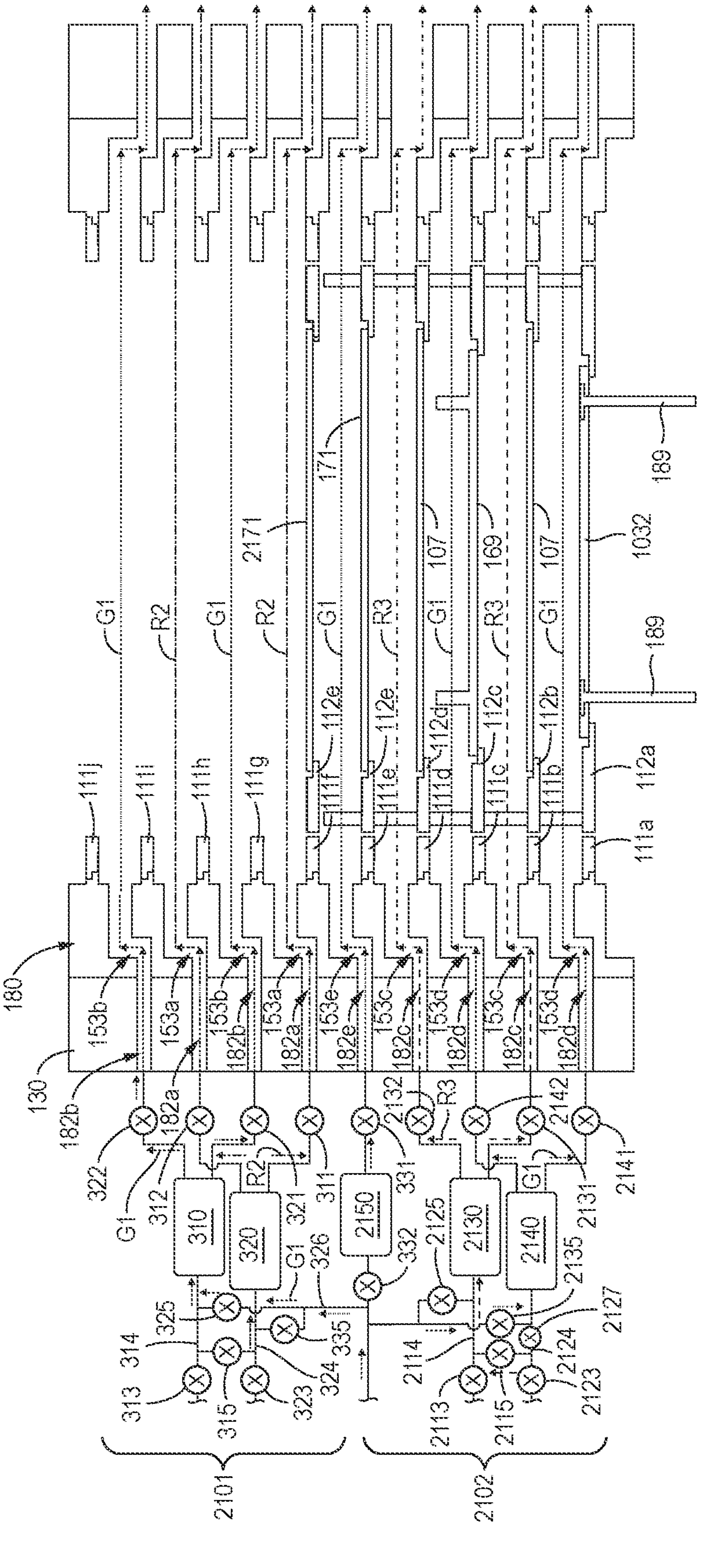

FIGS. 21A-21B are schematic partial side cross-sectional views of the processing chamber 100 and a gas circuit 2100 during a method of substrate processing, according to one or more embodiments.

The gas circuit 2100 is similar to the gas circuit 300 and includes one or more aspects, features, components, operations, and/or properties thereof. The first set of valves 311, 312 are in fluid communication with the first flow controller 310 and a first set of inject passages 182*a* that correspond to the first set of flow levels 153*a*.

The second set of valves 321, 322 are in fluid communication with the second flow controller 320 and a second set of inject passages 182*b* corresponding to a second set of flow levels 153*b*. The second set of inject passages 182*b* and the first set of inject passages 182*a* alternate with respect to each other along a first zone 2101 of the plurality of flow levels 153.

The gas circuit 2100 includes a third flow controller 2130, a third set of valves 2131, 2132 in fluid communication with the third flow controller 2130 and a third set of inject passages 182*c* corresponding to a third set of flow levels 153*c*, a fourth flow controller 2140, and a fourth set of valves 2141, 2142 in fluid communication with the fourth flow controller 2140 and a fourth set of inject passages 182*d* corresponding to a fourth set of flow levels 153*d*. The fourth set of inject passages 182*d* and the third set of inject passages 182*c* alternate with respect to each other along a second zone 2102 of the plurality of flow levels 153. The gas circuit 2100 includes a third supply valve 2113 and a third supply line 2114 in fluid communication with the third flow controller 2130, and a fourth supply valve 2123 and a fourth supply line 2124 in fluid communication with the fourth flow controller 2140. The gas circuit 2100 includes a fourth connection valve 2115 in fluid communication between the third supply line 2114 and the second supply line 2124 at locations downstream of the first supply valve 2113 and the second supply valve 2123. The gas circuit 2100 includes a second connection line 2126, a fifth connection valve 2125, and a sixth connection valve 2135. A valve 2127 can be disposed along the second supply line 2124 between the sixth connection valve 2135 and the fourth connection valve 2115. The gas circuit 2100 includes a fifth flow controller 2150 in fluid communication with the valve 331 and an intermediate inject passage 182*e* corresponding to an intermediate flow level 153*e*. A third plate 2171 is disposed above the second plate 171.

In the implementation shown in FIGS. 21A-21B, the processing chamber includes ten pre-heat rings 111*a*-111*j* and six arcuate supports 112*a*-112*f*.

In FIG. 21A the method includes flowing a third gas flow into the third set of flow levels 153*c* simultaneously with the flowing of the first gas flow into the first set of flow levels 153*a*, and flowing a fourth gas flow into the fourth set of flow levels 153*d* simultaneously with the flowing of the third gas flow. The third set of flow levels 153*c* and the fourth set of flow levels 153*d* alternate with respect to each other. The first gas flow includes the first reactive gas R1, the second gas flow includes the inert gas G1, the third gas flow includes the second reactive gas R2, and the fourth gas flow includes the inert gas G1. In one or more embodiments, the first reactive gas R1 is a deposition gas and the second reactive gas R2 is a cleaning gas that cleans the processing chamber 100 below the first plate 1032. In one or more embodiments, the first reactive gas R1 is an etching gas or a cleaning gas (e.g., a pre-clean gas), and the second reactive gas R2 is a cleaning gas that cleans the processing chamber 100 below the first plate 1032.

In FIG. 21A the substrates 107 are in a first position (e.g., an upper position).

In FIG. 21B, the substrates 107 are moved from the first position and to a second position (e.g., a lower position). The second reactive gas R2 flows into the first set of flow levels 153*a*, and the flow of the inert gas G1 into the second set of flow levels 153*b* is repeated. A third reactive gas R3 flows into the third set of flow levels 153*c*, and the flowing of the inert gas G1 into the fourth set of flow levels 153*d* is repeated. In one or more embodiments, the second reactive gas R2 is a cleaning gas that cleans the processing chamber 100 above the third plate 2171 and the third reactive gas R3 is a deposition gas. In one or more embodiments, the second reactive gas R2 is a cleaning gas that cleans the processing chamber 100 above the third plate 2171 and the third reactive gas R3 is an etching gas or a cleaning gas (e.g., a pre-clean gas).

Figure 22A:
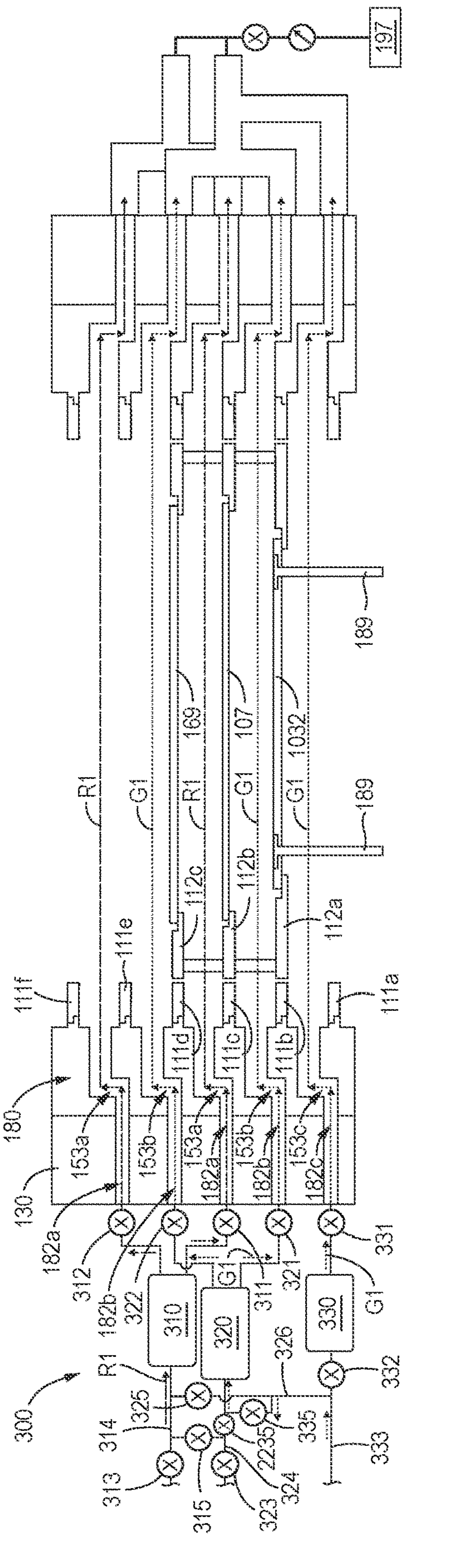
FIGS. 22A-22B are schematic partial side cross-sectional views of the processing chamber and the gas circuit during a method of substrate processing, according to one or more embodiments.
Figure 22B:
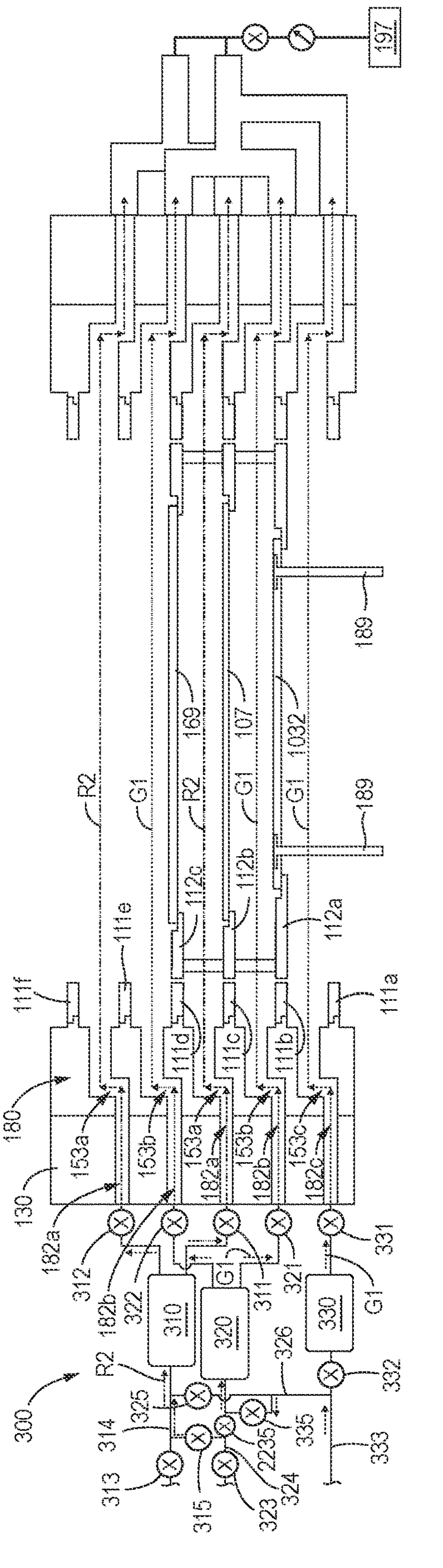

FIGS. 22A-22B are schematic partial side cross-sectional views of the processing chamber 100 and the gas circuit 2100 during a method of substrate processing, according to one or more embodiments. The method is similar to the method shown in FIGS. 3A-3D, and includes one or more aspects, features, components, operations, and/or properties thereof.

A single substrate 107 is processed at a time, and the second plate 171 is omitted. In FIG. 22A, the first reactive gas R1 flows into the first set of flow levels 153*a* to form the first layer 401 on the substrate 107, and the inert gas G1 flows into the second set of flow levels 153*b*. The present disclosure contemplates that a valve 2235 can be disposed along the second supply line 324 between the connection valve 315 and the third connection valve 335.

In FIG. 22B, the second reactive gas R2 flows into the first set of flow levels 153*a* to etch the first layer 401 on the substrate 107, and the inert gas G1 flows into the second set of flow levels 153*b*.

The present disclosure contemplates that FIG. 22B can be conducted prior to FIG. 22A, the reactive gas R2 in FIG. 22B is a pre-clean gas that cleans the substrate 107 (e.g., to remove an oxide from the substrate 107) and the reactive gas R1 in FIG. 22A is a deposition gas that deposits the first layer 401 on the cleaned substrate 107. The second reactive gas R2 used for etching and/or pre-cleaning can include plasma and/or can be plasma-assisted. In one or more embodiments, the second reactive gas R2 includes atomic radicals, such as atomic hydrogen radicals and/or atomic argon radicals.

Figure 23A:
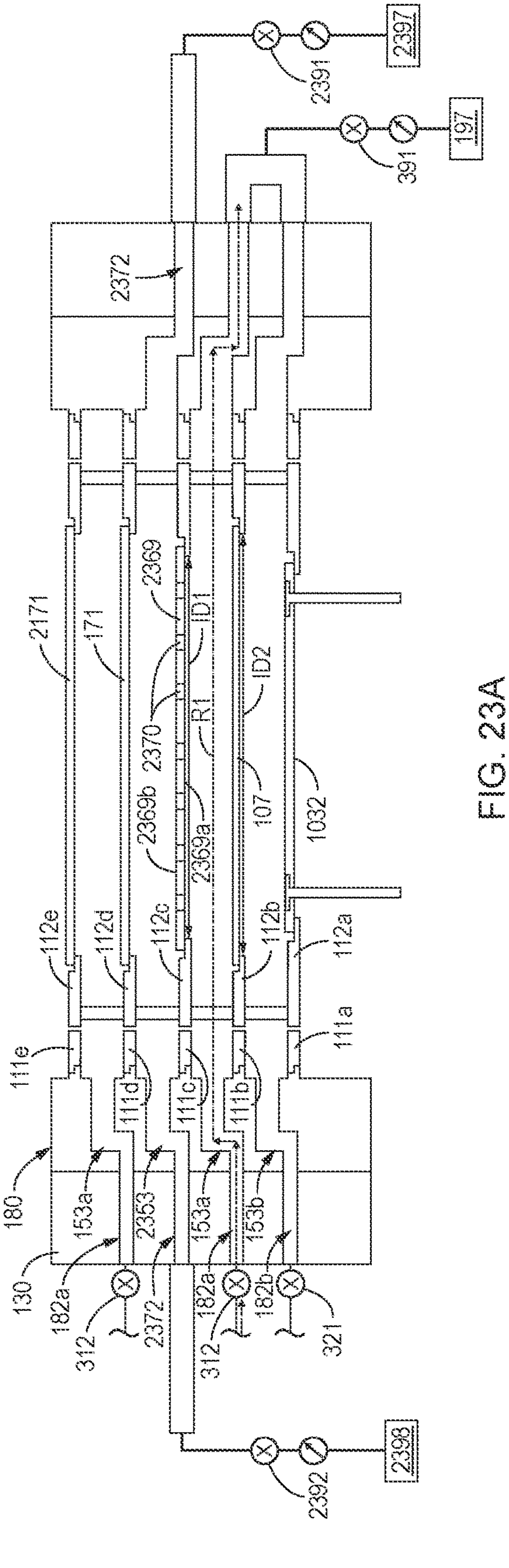
FIGS. 23A-23B are schematic partial side cross-sectional views of the processing chamber and the gas circuit during a method of substrate processing, according to one or more embodiments.
Figure 23B:
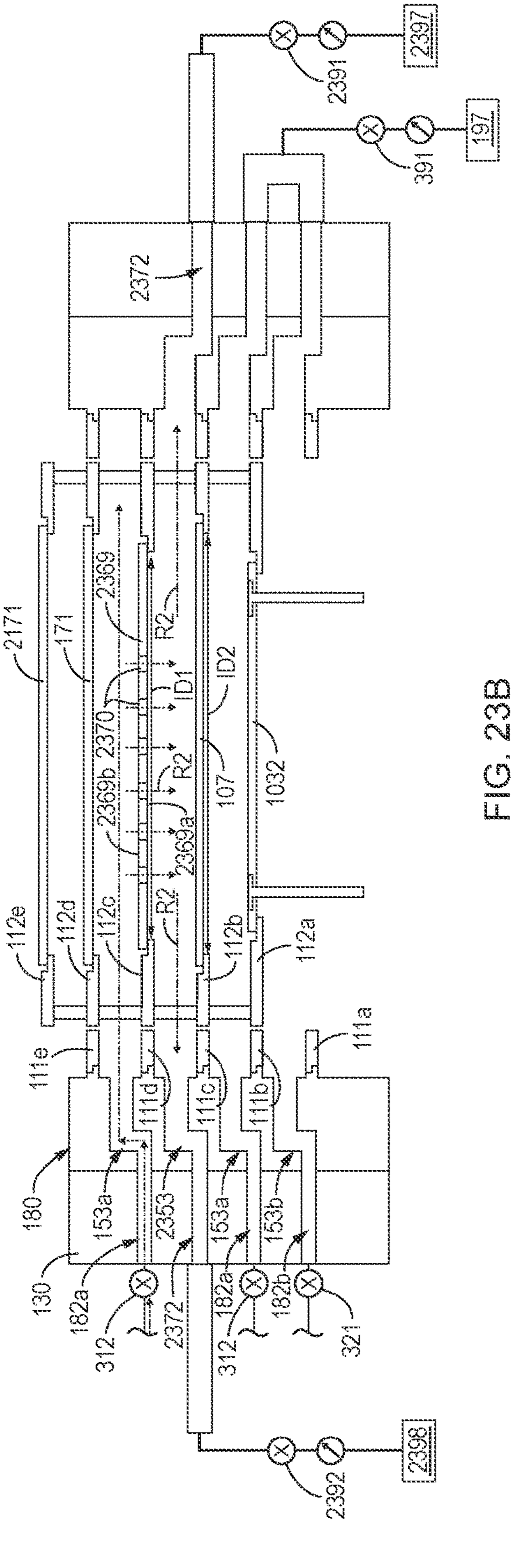

FIGS. 23A-23B are schematic partial side cross-sectional views of the processing chamber 100 and the gas circuit 2100 during a method of substrate processing, according to one or more embodiments. The method is similar to the method shown in FIGS. 3A-3D, and includes one or more aspects, features, components, operations, and/or properties thereof.

A single substrate 107 is processed at a time, and the second plate 171 and the third plate 2171 are included. In FIG. 23A, a first gas flow (e.g., the first reactive gas R1) flows into at least one of the first set of flow levels 153*a* (e.g., the lower flow level 153*a* of the first set of flow levels 153*a* in FIG. 23A) through at least one of the first set of valves 311, 312 (e.g., the lower valve 311 in FIG. 23A) to form the first layer 401 on the substrate 107. The lower flow level 153*a* can be referred to as a first flow level. The inert gas G1 can optionally flow or not flow into flow level 153*b*. The first reactive gas R1 is flows through one or more sidewalls of the chamber body and flows across the substrate 107 in a cross-flow manner from a side of the substrate 107. A second flow level 2353 between the first set of flow levels 153*a* includes a plurality of gas exhaust passages 2372 on opposing sides of the processing volume 128. The gas exhaust passages 2372 can be in fluid communication with each other at least partially circumferentially about the processing volume 128. For example the gas exhaust passages 2372 can include one or more openings that extend arcuately in the chamber body 130. In FIG. 23A, the substrate 107 is in a first position (e.g., a lower position).

A first arcuate support 112*b* supports the substrate 107, a second arcuate support 112*c* spaced from the first arcuate support 112*b* supports the plate 2369, and a third arcuate support 112*d* spaced from the second arcuate support 112*c* supports the second plate 171. A fourth arcuate support 112*e* spaced from the third arcuate support 112*d* supports the third plate 2171. The second plate 171 is disposed above the plate 2369, and the third plate 2171 is disposed above the second plate 171.

As shown in FIG. 23A, the plate 2369 is sized and shaped for positioning on the second arcuate support 112*c*, the second plate 171 is sized and shaped for positioning on the third arcuate support 112*d*, and the third plate 2171 is sized and shaped for positioning on the fourth arcuate support 112*e*. In one or more embodiments, an inner dimension ID1 (e.g., an inner diameter) of the second arcuate support 112*c* is less than an inner dimension ID2 (e.g., an inner diameter) of the first arcuate support 112*b*.

In FIG. 23B, the substrate 107 moves from the first position and to a second position (e.g., an upper position). A plate 2369 is disposed between the substrate 107 and the second plate 171. The plate 2369 is similar to the plate 169 and includes one or more aspects, features, components, operations, and/or properties thereof. A plurality of openings 2370 are formed through the plate 2369 such that the plate 2369 can function as a gas distribution plate (e.g., a showerhead) in FIG. 23B. In one or more embodiments, the plurality of openings include a plurality of through holes extending through the plate 2369. In one or more embodiments, the second plate 171 has a solid cross section across an outer dimension (e.g., an outer diameter) of the second plate 171. In one or more embodiments, the third plate 2171 has a solid cross section across an outer dimension (e.g., an outer diameter) of the third plate 2171.

The plate 2369 includes (e.g., is formed of and/or is coated with) one or more of quartz (such as transparent quartz, e.g. clear quartz; opaque quartz, e.g. white quartz, grey quartz, and/or black quartz), silicon carbide (SiC), graphite coated with SiC and/or opaque quartz, and/or one or more ceramics (such as alumina (aluminum oxide ($Al_2O_3$)), Aluminum nitride (AlN), Silicon Nitride ($Si_3N_4$), Boron Nitride (BN), and/or Boron Carbide ($B_4C$))). In one or more embodiments, the plate 2369 is formed of SiC or is coated with SiC. In one or more embodiments, the plate 2369. Material(s) described for the plate 2369 can be used for the plate 169 described above, the second plate 171, the third plate 2171, and/or the first plate 1032. The plate 2369 can be transparent or opaque. In one or more embodiments, the plate 2369 includes at least one opaque outer surface 2369*a*, 2369*b* (a plurality is shown in FIGS. 23A and 23B). The at least one opaque outer surface 2369*a*, 2369*b* can be part of any of the opaque materials described herein.

A second gas flow (e.g., the second reactive gas R2) flows into at least one of the first set of flow levels 153*a* (e.g., the upper flow level 153*a* of the first set of flow levels 153*a* in FIG. 23B) through at least one of the first set of valves 311, 312 (e.g., the upper valve 312 in FIG. 23B). The upper flow level 153*a* can be referred to as a third flow level. The second reactive gas R2 flows into the upper flow level 153*a*, past the plate 2369 disposed above the substrate 107, and into the second flow level 2353 to etch the first layer 401 on the substrate 107. The second reactive gas R2 flows over the substrate 107 after flowing past the plate 2369. In one or more embodiments, the second reactive gas R2 flows through the openings 2370. The second reactive gas R2 flows into the substrate 107 from above the substrate 107, and the second reactive gas R2 flows over the substrate 107 in a radial manner. As an example, the second reactive gas R2 flows in a radially outward direction across the substrate 107. The present disclosure contemplates that the plate 2369 can be disposed below the substrate 107, and the second reactive gas R2 can flow into the substrate 107 from below the substrate 107.

The inert gas G1 can optionally flow or not flow into flow level 153*b*. The second reactive gas R2 can be circumferentially pumped from the flow level 2353 using the gas exhaust passages 2372. One or more second exhaust valves 2391, 2392 (two are shown) are in fluid communication with the flow level 2353 and one or more second pumping devices 2397, 2398. In one or more embodiments, the one or more second exhaust valves 2391, 2392 are closed during the operations of FIG. 23A, and then are opened between FIGS. 23A and 23B and during the operations of FIG. 23B. The one or more second exhaust valves 2391, 2392 can be opened prior to moving the substrate 107 in between FIGS. 23A and 23B. In one or more embodiments, the one or more second exhaust valves 2391, 2392 are open during at least part of FIG. 23A. The exhaust valve 391 can be open during FIG. 23A, and open or closed during FIG. 23B.

After FIGS. 23A and 23B, inert gas G1 and/or cleaning gas can flow through the flow levels 153*a*, 153*b*, 2353.

The present disclosure contemplates that FIG. 23B can be conducted prior to FIG. 23A, the reactive gas R2 in FIG. 23B is a pre-clean gas that cleans the substrate 107 (e.g., to remove an oxide from the substrate 107) and the reactive gas R1 in FIG. 23A is a deposition gas that deposits the first layer 401 on the cleaned substrate 107. The second reactive gas R2 used for etching and/or pre-cleaning can include plasma and/or can be plasma-assisted. In one or more embodiments, the second reactive gas R2 includes atomic radicals, such as atomic hydrogen radicals and/or atomic argon radicals.

The present disclosure contemplates that the second reactive gas R2 can flow from above the third plate 2171 (e.g., through the lid 104 of the processing chamber 100), past the third plate 2171, past the second plate 171, and through the openings 2370 of the plate 2369. The second plate 171 and/or the third plate 2171 can include one or more openings formed therethrough to allow the second reactive gas R2 to flow therethrough prior to flowing through the openings 2370 of the plate 2369. In such an embodiment, the upper heat sources 106 can be omitted and the lower heat sources 138 can be included.

Figure 24A:
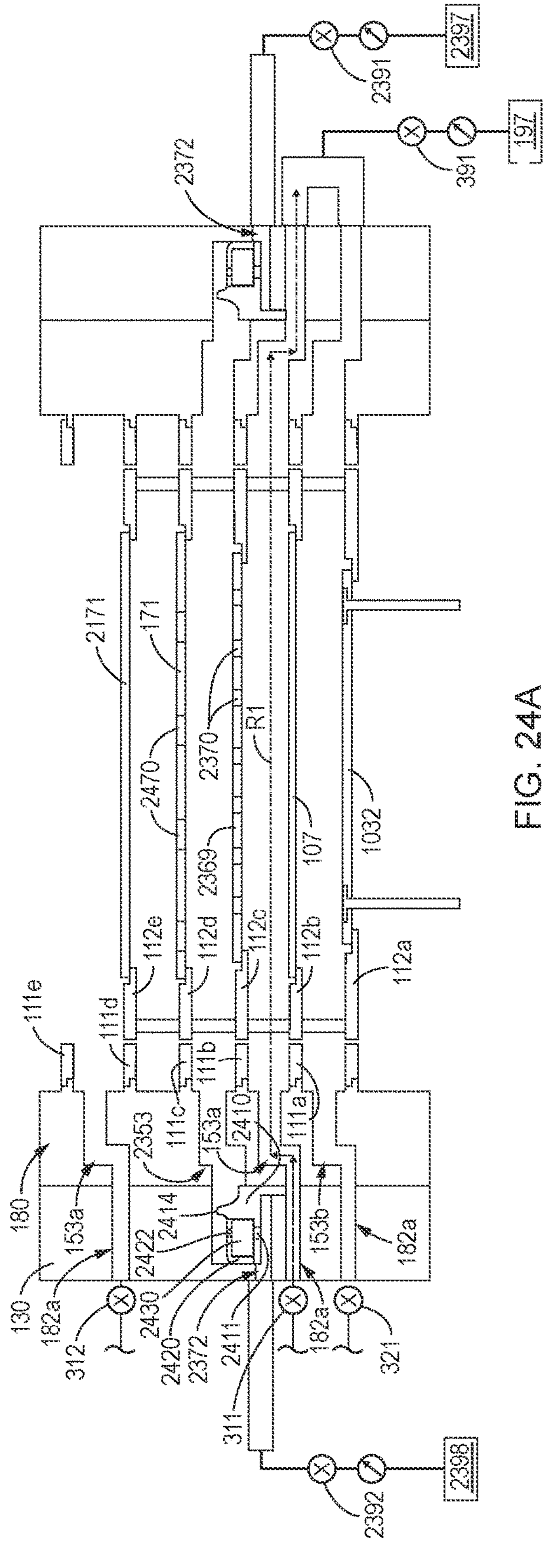
FIGS. 24A-24B are schematic partial side cross-sectional views of the processing chamber and the gas circuit during a method of substrate processing, according to one or more embodiments.
Figure 24B:
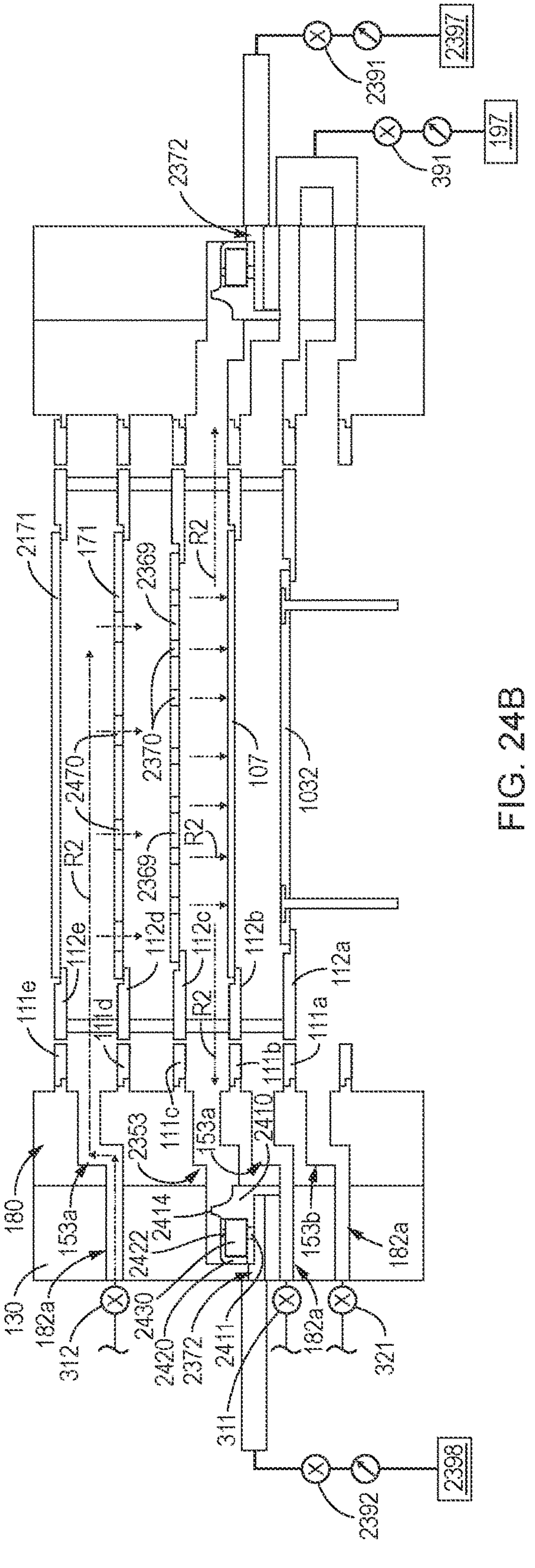

FIGS. 24A-24B are schematic partial side cross-sectional views of the processing chamber 100 and the gas circuit 2100 during a method of substrate processing, according to one or more embodiments. The method is similar to the method shown in FIGS. 23A-23B, and includes one or more aspects, features, components, operations, and/or properties thereof.

In FIG. 24A, a first gas flow (e.g., the first reactive gas R1) flows into at least one of the first set of flow levels 153*a* (e.g., the lower flow level 153*a* in FIG. 24A) through at least one of the first set of valves 311 (e.g., the lower valve 311 in FIG. 24A) to form the first layer 401 on the substrate 107. The lower flow level 153*a* can be referred to as a first flow level. The inert gas G1 can optionally flow or not flow into the lower flow level 153*b* of the second set of flow levels 153*b*. The first reactive gas R1 is flows through one or more sidewalls of the chamber body and flows across the substrate 107 in a cross-flow manner from a side of the substrate 107.

The second plate 171 includes a plurality of second openings 2470 formed therein. In one or more embodiments, a first number of the plurality of openings 2370 is higher than a second number of the plurality of second openings 2470. In one or more embodiments, the plurality of second openings 2470 are larger than the plurality of openings 2370. The second plate 171 can function as a second gas distribution plate (e.g., a second showerhead) in FIG. 24B, in addition to the plate 2369. In one or more embodiments, the plurality of second openings 2470 include a plurality of through holes extending through the second plate 171.

In FIG. 24B, a second gas flow (e.g., the second reactive gas R2) flows into at least one of the first set of flow levels 153*a* (e.g., the upper flow level 153*a* of the first set of flow levels 153*a* in FIG. 24B) through at least one of the first set of valves 311, 312 (e.g., the upper valve 312 in FIG. 24B). The upper flow level 153*a* can be referred to as a third flow level. The second reactive gas R2 flows into the upper flow level 153*a*, past the second plate 171 disposed above the plate 2369, and past the plate 2369 disposed above the substrate 107, and into the second flow level 2353 to etch the first layer 401 on the substrate 107. The second reactive gas R2 flows over the substrate 107 after flowing past the second plate 171 and the plate 2369. The present disclosure contemplates that the plate 2369 and/or the second plate 171 can be disposed below the substrate 107. In one or more embodiments, the second reactive gas R2 flows through the second openings 2470 and through the openings 2370. The second reactive gas R2 flows into the substrate 107 from above the substrate 107, and the second reactive gas R2 flows over the substrate 107 in the radial manner.

The inert gas G1 can optionally flow or not flow into the flow level 153*b* and/or the first flow level 153*a*. The second reactive gas R2 can be circumferentially pumped from the flow level 2353 using the gas exhaust passages 2372. In one or more embodiments, the chamber body includes a pumping ring 2410 that includes an arcuate exhaust opening 2430 in fluid communication with the one or more exhaust passages 2372 of the second flow level 2353. In one or more embodiments, the arcuate exhaust opening 2430 extends circumferentially about the processing volume 128. The arcuate exhaust opening 2430 extends circumferentially about a body of the pumping ring 2410. The arcuate exhaust opening 2430 is disposed between the pumping ring 2410 and a cover plate 2420. The cover plate 2420 is disposed on the pumping ring 2410. As the second reactive gas R2 flows out of the second flow level 2353, the second reactive gas R2 flows over a ledge 2414 of the pumping ring 2410, through one or more openings 2422 of the cover plate 2420, and into the arcuate exhaust opening 2430. The second reactive gas R2 then flows into the one or more exhaust passages 2372 through one or more openings 2411 of the pumping ring 2410. The one or more openings 2422 can include a plurality of openings disposed circumferentially about the processing volume 128. The one or more openings 2411 can include a plurality of openings that can oppose each other across the processing volume 128.

The pumping ring 2410 and the cover plate 2420 can be used in the method shown in FIGS. 23A and 23B. In one or more embodiments, the pumping ring 2410 includes a metal and the cover plate 2420 includes the same material(s) as described for the one or more liners 180 and/or the plate 2369. In one or more embodiments, the pumping ring 2410 includes the same material(s) as described for the one or more liners 180 and/or the plate 2369.

In one or more embodiments, the one or more second exhaust valves 2391, 2392 are closed during the operations of FIG. 24A, and then are opened between FIGS. 24A and 24B and during the operations of FIG. 24B. The one or more second exhaust valves 2391, 2392 can be opened prior to moving the substrate 107 in between FIGS. 24A and 24B. In one or more embodiments, the one or more second exhaust valves 2391, 2392 are open during at least part of FIG. 24A. The exhaust valve 391 can be open during FIG. 24A, and open or closed during FIG. 24B. In one or more embodiments, inert gas IG1 can flow through the lower flow level 153*a* simultaneously with the flowing of the second reactive gas R2.

After FIGS. 24A and 24B, inert gas G1 and/or cleaning gas can flow through the flow levels 153*a*, 153*b*, 2353.

The present disclosure contemplates that FIG. 24B can be conducted prior to FIG. 24A, the reactive gas R2 in FIG. 24B can be a pre-clean gas that cleans the substrate 107 (e.g., to remove an oxide from the substrate 107) and the reactive gas R1 in FIG. 24A can be a deposition gas that deposits the first layer 401 on the cleaned substrate 107.

The present disclosure contemplates that the second reactive gas R2 can flow from above the third plate 2171 (e.g., through the lid 104 of the processing chamber 100), past the third plate 2171, through the second openings 2470 of the second plate 171, and through the openings 2370 of the plate 2369. The third plate 2171 can include one or more openings formed therethrough to allow the second reactive gas R2 to flow therethrough prior to flowing through the second openings 2470 of the third plate 2171. In such an embodiment, the upper heat sources 106 can be omitted and the lower heat sources 138 can be included.

The present disclosure contemplates that the third plate 2171 and/or the second plate 171 can be omitted in FIGS. 23A and 24B and/or FIGS. 24A and 24B. The present disclosure contemplates that one or more of the plate 2369, the second plate 171, or the third plate 2171 can be coupled together (e.g., fused together and/or integrally formed together).

The present disclosure also contemplates that one or more of the plate 2369, the second plate 171 (if used), or the third plate 2171 (if used) can be disposed on stationary portions of the process chamber 100, such as inner ledges of the one or more lines 180. In such an embodiment, the plate(s) 169, 171, 2171 can remain stationary as the cassette 1030 supporting the substrate 107 is raised and lowered. In such an embodiment, the second reactive gas R2 can flow from above the plate(s) (e.g., through the lid 104).

Figure 25:
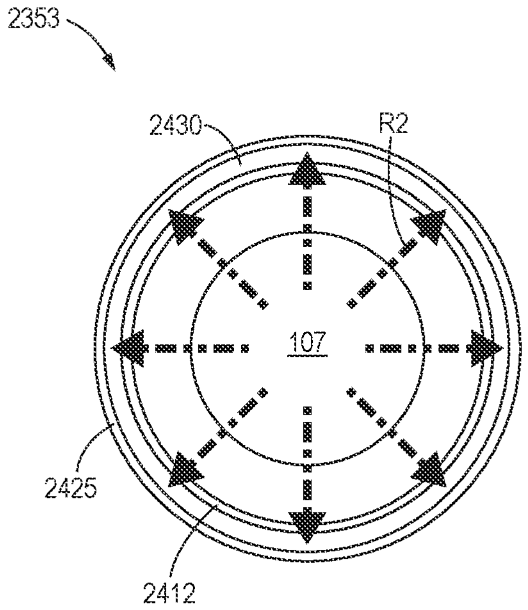
FIG. 25 is a schematic partial top view of the second flow level shown in FIG. 24B, according to one or more embodiments.

FIG. 25 is a schematic partial top view of the second flow level 2353 shown in FIG. 24B, according to one or more embodiments.

The arcuate exhaust opening 2430 is between a first wall 2412 (e.g., an inner wall) of the pumping ring 2410 and a second wall 2425 (e.g., an outer wall) of the cover plate 2420. FIG. 25 shows the second reactive gas R2 flowing in the radial manner.

Figure 26:
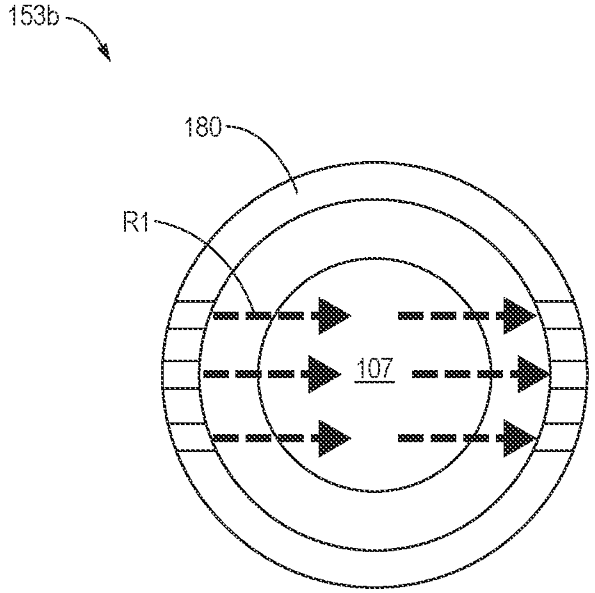
FIG. 26 is a schematic partial top view of the first flow level shown in FIG. 24A, according to one or more embodiments.

FIG. 26 is a schematic partial top view of the first flow level 153*b* shown in FIG. 24A, according to one or more embodiments.

FIG. 26 shows the first reactive gas R1 flowing in the cross-flow manner.

Figure 27:
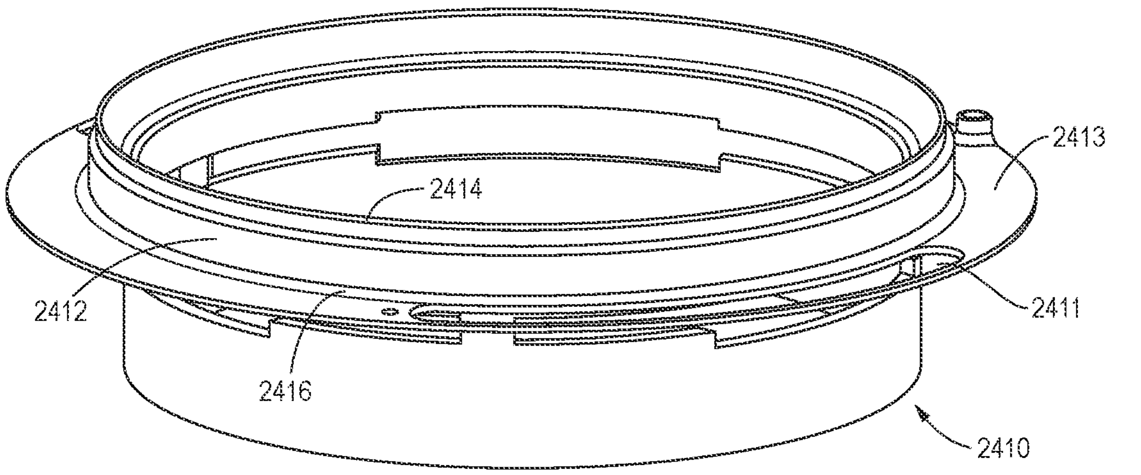
FIG. 27 is a schematic perspective top view of the pumping ring shown in FIGS. 24A and 24B, according to one or more embodiments.

FIG. 27 is a schematic perspective top view of the pumping ring 2410 shown in FIGS. 24A and 24B, according to one or more embodiments.

The one or more openings 2411 of the pumping ring 2410 are formed in an outer ledge 2413.

Figure 28:
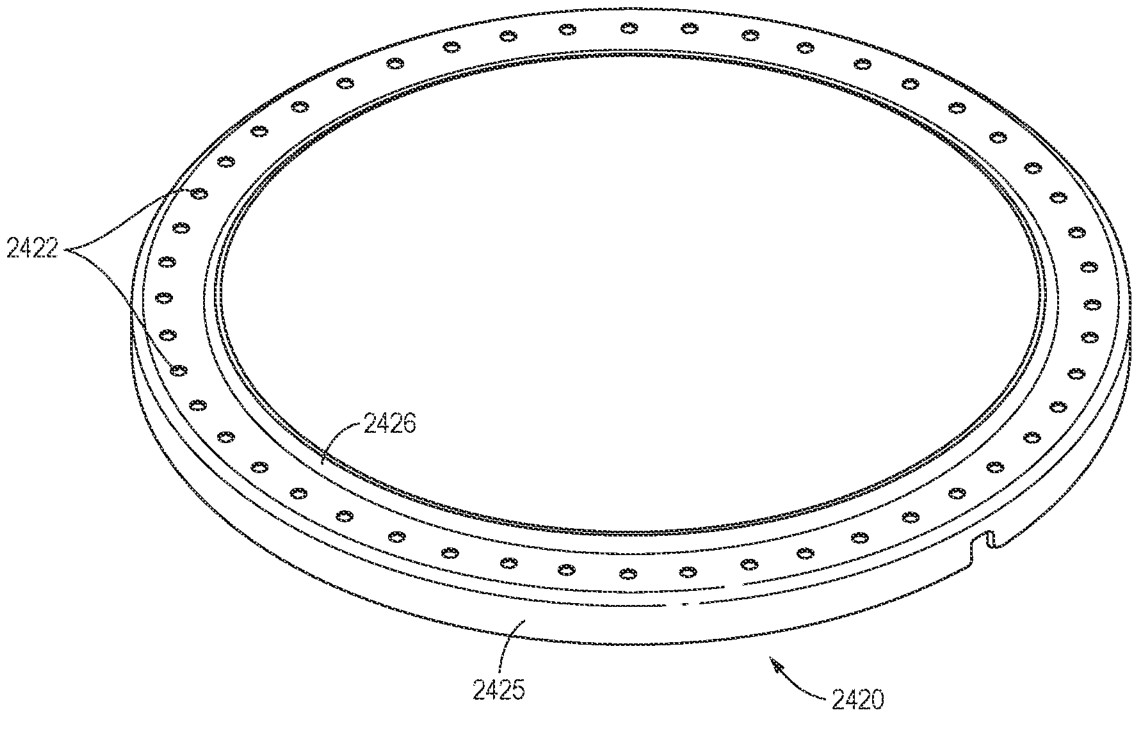
FIG. 28 is a schematic perspective top view of the cover plate shown in FIGS. 24A and 24B, according to one or more embodiments.

FIG. 28 is a schematic perspective top view of the cover plate 2420 shown in FIGS. 24A and 24B, according to one or more embodiments.

The cover plate 2420 includes a tapered inner surface 2426 that interfaces with a tapered outer surface 2416 (shown in FIG. 27) of the pumping ring 2410.

Figure 29:
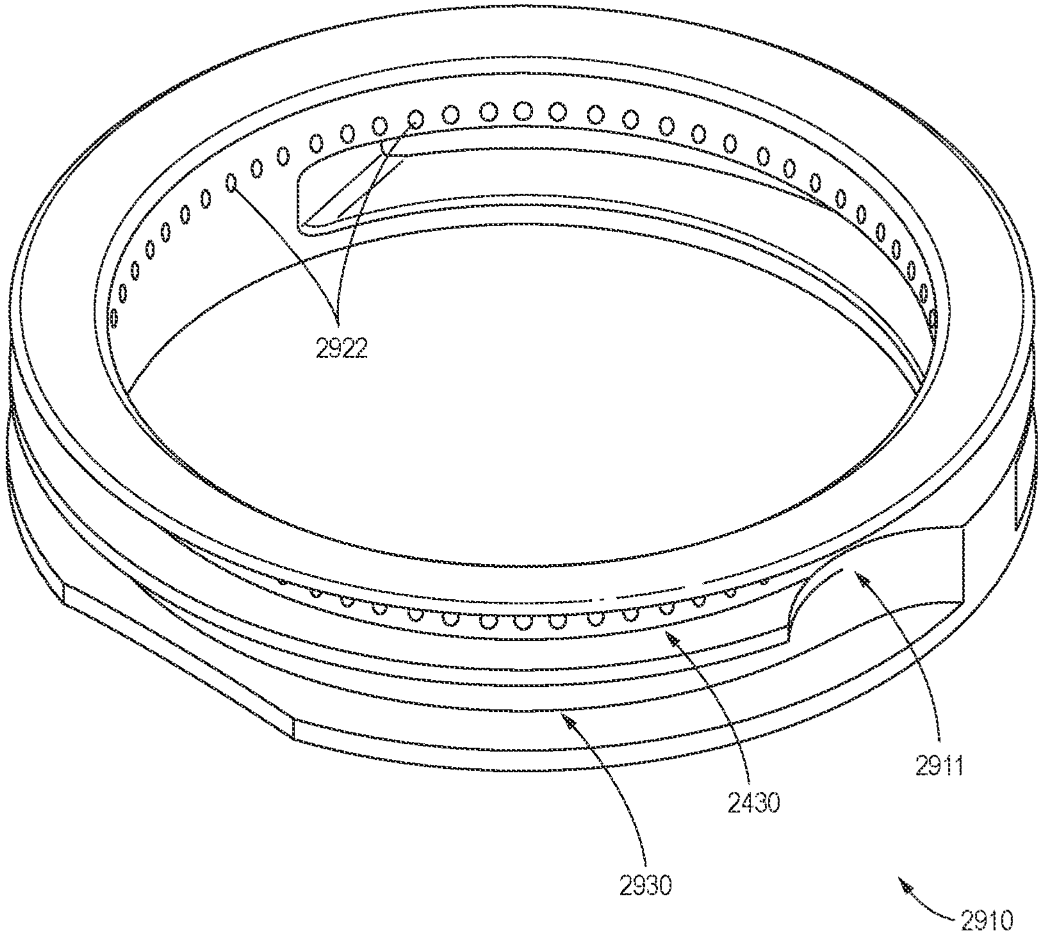
FIG. 29 is a schematic perspective top view of a pumping ring, according to one or more embodiments.

FIG. 29 is a schematic perspective top view of a pumping ring 2910, according to one or more embodiments.

The pumping ring 2910 can be used in place of the pumping ring 2410 shown in FIGS. 24A, 24B, and 28. The pumping ring 2910 includes one or more aspects, features, components, operations, and/or properties of the pumping ring 2410.

The arcuate exhaust opening 2430 extends circumferentially about a body of the pumping ring 2910. The cover plate 2420 can be used or omitted in relation to the pumping ring 2910. As the second reactive gas R2 flows out of the second flow level 2353, the second reactive gas R2 flows through one or more openings 2922 and into the arcuate exhaust opening 2430. The second reactive gas R2 then flows into the one or more exhaust passages 2372 through one or more openings 2911 of the pumping ring 2910 and a second arcuate exhaust opening 2930 of the pumping ring 2910. The one or more openings 2922 can include a plurality of openings disposed circumferentially about the processing volume 128. The one or more openings 2911 can include a plurality of openings that can oppose each other across the processing volume 128.

In one or more embodiments, the controller 1070 controls components (such as valves and/or flow controllers) described herein to cause the operations of the methods described herein to be conducted. For example, in relation to FIGS. 21A and 21B, the controller 1070 can open the first set of valves 311, 312 to flow the first gas flow (including the first reactive gas R1) into the first set of flow levels 153*b*, and the controller 1070 can open the second set of valves 321, 322 to flow the second gas flow (including the purge gas G1) into the second set of flow levels 153*b*. The controller 1070 can also power one or more heat sources (such as the heat sources 106, 138) while the first reactive gas R1 flows. The controller 1070 can power a lift device (such as one or more motors 164) to move the substrates 107 from the first position in FIG. 21A and to the second position in FIG. 21B. The controller 1070 can then close the first connection valve 315 and open the second supply valve 323 to flow the third gas flow (including the second reactive gas R2) into the second set of flow levels 153*b*. The controller 1070 can also close the first supply valve 313 and open a second connection valve 325 to flow the second gas flow (including the inert gas G1) into the first set of flow levels 153*a*.

As another example, in relation to FIG. 3C, the controller 1070 can close the first connection valve 315 and the first supply valve 313. The controller 1070 can also open the second connection valve 325 to flow the second gas flow (including the inert gas G1) into the first set of flow levels 153*a*, and open the second supply valve 323 to flow a third gas flow (including the second reactive gas R2) into the second set of flow levels 153*b*.

As another example, in relation to FIG. 3C, the controller 1070 can close the first connection valve 315 and the first supply valve 313. The controller 1070 can also open the second connection valve 325 to flow the second gas flow (including the inert gas G1) into the first set of flow levels 153*a*, and open the second supply valve 323 to flow a third gas flow (including the second reactive gas R2) into the second set of flow levels 153*b*.

As another example, in relation to FIG. 6, the controller 1070 can close the first supply valve 313. The controller 1070 can also open the connection valve 315 to flow the second gas flow (including the second reactive gas G2) into the first set of flow levels 153*a*. The controller 1070 can then close the second supply valve 323, open the third supply valve 332, and open the third connection valve 335 to flow a third gas flow (including the inert gas G1) into the second set of flow levels 153*b*.

The present disclosure contemplates that reactive gases flowing simultaneously can involve the same pressure and/or the same temperature. The present disclosure also contemplates that reactive gases involving differing pressures and/or differing temperatures can be flowed sequentially with respect to each other. As described herein, processing (e.g., deposition or cleaning) can be single-sided for substrates and/or dual-sided for substrates.

Figure 30:
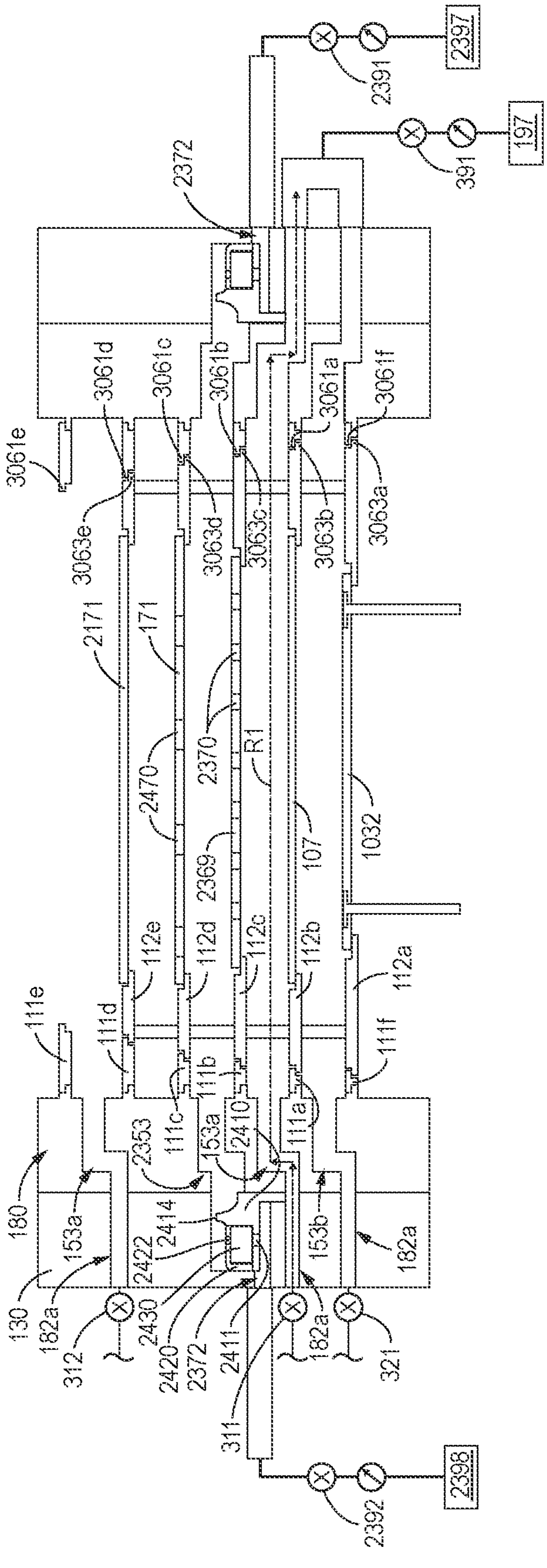
FIG. 30 is a schematic partial side cross-sectional view of the processing chamber and the gas circuit during a method of substrate processing, according to one or more embodiments.

FIG. 30 is a schematic partial side cross-sectional view of the processing chamber 100 and the gas circuit 2100 during a method of substrate processing, according to one or more embodiments. The method is similar to the method shown in FIGS. 24A-24B, and includes one or more aspects, features, components, operations, and/or properties thereof.

In the implementation shown in FIG. 30, the first plate 1032, the substrate 107, the 2370, the plate 2369, the plate 171, and/or the second plate 2171 can be supported by one or more inner ledges of the respective arcuate supports 112*a*-112*e*.

The pre-heat rings 111*a*-111*f* respectively include recessed inner surfaces that define inner ledges 3061*a*-3061*f*. Inner diameters of the recessed inner surfaces and the inner ledges 3061*a*-3061*f* gradually decrease from a lowermost pre-heat ring 111*f* and to an uppermost pre-heat ring 111*e*. For example, the first pre-heat ring 111*a* includes a first inner ledge 3061*a* having a first inner diameter, the second pre-heat ring 3061*b* includes a second inner ledge 3061*b* having a second inner diameter that is lesser than the first inner diameter, and the third pre-heat ring 111*c* includes a third inner ledge 3061*c* having a third inner diameter that is lesser than the second inner diameter.

The arcuate supports 112*a*-112*e* respectively include recessed outer surfaces that define outer ledges 3063*a*-3063*e*. Outer diameters of the recessed outer surfaces and the outer ledges 3063*a*-3063*e* gradually decrease from a lowermost arcuate support 112*a* and to an uppermost arcuate support 112*e*. The inner ledges 3061*a*-306*e* of the pre-heat rings 111*a*-111*f* respectively overlap with the outer edges 3063*a*-3063*e* of the arcuate supports 112*a*-112*e*.

Benefits of the present disclosure include modularity in processing applications (e.g. forming a variety of device structures-such as complex structures- and/or conducting a variety of cleaning operations) using a single processing chamber and/or a single gas circuit); higher film growth rates; enhanced gas activation; uniform film growth; increased throughput; and reduced chamber footprints. Benefits of the present disclosure also include enhanced device performance and thermal control and adjustability for zones.

Such benefits can be facilitated for processing a single substrate at a time, and/or batch processing a plurality of substrates simultaneously.

It is contemplated that one or more aspects disclosed herein may be combined. As an example, one or more aspects, features, components, operations, and/or properties of the various implementations of the processing chamber 100, the controller 1070, the gas circuit 300, the fourth supply valve 343, the method shown in FIGS. 3A-3D, the substrate structure 400 and/or the associated method(s), the method shown in FIG. 6, the method shown in FIGS. 7A and 7B, the substrate structure 800 and/or the associated method(s), the method shown in FIG. 9, the substrate structure 1000 and/or the associated method(s), the substrate structure 1100 and/or the associated method(s), the method shown in FIG. 12, the substrate structure 1300 and/or the associated method(s), the substrate structure 1400 and/or the associated method(s), the method shown in FIGS. 15A-15F, the substrate structure 1600 and/or the associated method(s), the method shown in FIGS. 17A-17F, the substrate structure 1800 and/or the associated method(s), the substrate structure 1900 and/or the associated method(s), the substrate structure 2000 and/or the associated method(s), the gas circuit 2100, the method shown in FIGS. 21A and 21B, the method shown in FIGS. 22A and 22B, the method shown in FIGS. 23A and 23B, the method shown in FIGS. 24A and 24B, the second flow level 2353 shown in FIG. 25, the first flow level 153*b* shown in FIG. 26, the pumping ring 2410, the pumping ring 2910, and/or the cover plate 2420 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

The invention claimed is:

1. A processing chamber applicable for semiconductor manufacturing, comprising:

- a chamber body comprising:
  - a processing volume,
  - a plurality of inject passages formed in the chamber body and arranged in a plurality of flow levels, and
  - one or more exhaust passages formed in the chamber body;
- one or more heat sources configured to heat the processing volume; and
- a gas circuit in fluid communication with the chamber body, the gas circuit comprising:
  - a first flow controller,
  - a first set of valves in fluid communication with the first flow controller, the first set of valves in fluid communication with a first set of inject passages,
  - a first supply valve and a first supply line in fluid communication with the first flow controller,
  - a second flow controller,
  - a second set of valves in fluid communication with the second flow controller, the second set of valves in fluid communication with a second set of inject passages, the second set of inject passages and the first set of inject passages alternating with respect to each other along the plurality of flow levels,
  - a second supply valve and a second supply line in fluid communication with the second flow controller, and
  - a connection valve in fluid communication between the first supply line and the second supply line at locations downstream of the first supply valve and the second supply valve.

2. The processing chamber of claim 1, wherein the gas circuit further comprises:

- a third flow controller; and
- a valve in fluid communication with a lower inject passage below the first set of inject passages and the second set of inject passages.

3. The processing chamber of claim 2, wherein the gas circuit further comprises:

- a third supply valve and a third supply line in fluid communication with the third flow controller.

4. The processing chamber of claim 3, wherein the gas circuit further comprises:

- a second connection valve in fluid communication between the third supply line and the first supply line at a location downstream of the first supply valve.

5. The processing chamber of claim 4, wherein the gas circuit further comprises:

- a third connection valve in fluid communication between the third supply line and the second supply line at a location downstream of the second supply valve.

6. The processing chamber of claim 3, wherein the gas circuit further comprises:

a fourth supply valve and a fourth supply line in fluid communication with the second flow controller.

7. The processing chamber of claim 1, wherein the first flow controller and the second flow controller is each a flow ratio controller (FRC).

8. The processing chamber of claim 1, further comprising a cassette disposed in the processing volume, the cassette comprising a plurality of arcuate supports, and the plurality of inject passages in fluid communication with respective flow paths above the plurality of arcuate supports.

9. A gas circuit applicable for semiconductor manufacturing, comprising:

a first flow controller;

a first set of valves in fluid communication with the first flow controller;

a first supply valve and a first supply line in fluid communication with the first flow controller;

a second flow controller;

a second set of valves in fluid communication with the second flow controller, the second set of valves and the first set of valves alternating with respect to each other;

a second supply valve and a second supply line in fluid communication with the second flow controller; and a connection valve in fluid communication between the first supply line and the second supply line at locations downstream of the first supply valve and the second supply valve.

10. The gas circuit of claim 9, wherein the gas circuit further comprises:

a third flow controller; and a valve in fluid communication with the third flow controller.

11. The gas circuit of claim 10, wherein the gas circuit further comprises:

a third supply valve and a third supply line in fluid communication with the third flow controller.

12. The gas circuit of claim 11, wherein the gas circuit further comprises:

a second connection valve in fluid communication between the third supply line and the first supply line at a location downstream of the first supply valve.

13. The gas circuit of claim 12, wherein the gas circuit further comprises:

a third connection valve in fluid communication between the third supply line and the second supply line at a location downstream of the second supply valve.

14. The gas circuit of claim 11, wherein the gas circuit further comprises:

a fourth supply valve and a fourth supply line in fluid communication with the second flow controller.

15. A processing chamber applicable for semiconductor manufacturing, comprising:

a chamber body comprising a plurality of inject passages arranged in a plurality of flow levels; and a gas circuit in fluid communication with the chamber body, the gas circuit comprising:

a first flow controller, a first set of valves in fluid communication with the first flow controller, the first set of valves in fluid communication with a first set of inject passages, a first supply valve and a first supply line in fluid communication with the first flow controller, a second flow controller, a second set of valves in fluid communication with the second flow controller, the second set of valves in fluid communication with a second set of inject passages, the second set of inject passages and the first set of inject passages alternating with respect to each other along a first zone of the plurality of flow levels, a second supply valve and a second supply line in fluid communication with the second flow controller, and a connection valve in fluid communication between the first supply line and the second supply line at locations downstream of the first supply valve and the second supply valve, a third flow controller, a third set of valves in fluid communication with the third flow controller, the third set of valves in fluid communication with a third set of inject passages, a fourth flow controller, a fourth set of valves in fluid communication with the fourth flow controller, the fourth set of valves in fluid communication with a fourth set of inject passages, the fourth set of inject passages and the third set of inject passages alternating with respect to each other along a second zone of the plurality of flow levels.

16. The processing chamber of claim 15, wherein the gas circuit further comprises:

a third supply valve and a third supply line in fluid communication with the third flow controller; and a fourth supply valve and a fourth supply line in fluid communication with the fourth flow controller.

17. The processing chamber of claim 15, wherein the gas circuit further comprises:

a third supply valve and a third supply line in fluid communication with the third flow controller.

18. The processing chamber of claim 17, wherein the gas circuit further comprises:

a second connection valve in fluid communication between the third supply line and the first supply line at a location downstream of the first supply valve.

19. The processing chamber of claim 15, wherein the first flow controller, the second flow controller, the third flow controller, and the fourth flow controller is each a flow ratio controller (FRC).

20. The processing chamber of claim 15, further comprising a cassette, the cassette comprising a plurality of arcuate supports, and the plurality of inject passages in fluid communication with respective flow paths above the plurality of arcuate supports.

* * * * *